(12) United States Patent
Oh et al.

(10) Patent No.: US 11,049,533 B1
(45) Date of Patent: Jun. 29, 2021

(54) SEMICONDUCTOR SYSTEM AND SEMICONDUCTOR DEVICE

(71) Applicant: SK hynix Inc., Icheon-si (KR)

(72) Inventors: Min Wook Oh, Icheon-si (KR); Myung Kyun Kwak, Yongin-si (KR); Min O Kim, Seoul (KR); Chang Ki Baek, Anyang-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/874,359

(22) Filed: May 14, 2020

(30) Foreign Application Priority Data

Dec. 16, 2019 (KR) .................. 10-2019-0168081

(51) Int. Cl.
*G11C 8/18* (2006.01)
*G11C 7/10* (2006.01)
*G11C 8/08* (2006.01)

(52) U.S. Cl.
CPC .............. *G11C 7/1096* (2013.01); *G11C 8/08* (2013.01); *G11C 8/18* (2013.01)

(58) Field of Classification Search
CPC ............ G11C 7/1096; G11C 8/18; G11C 8/08
See application file for complete search history.

(56) References Cited

U.S. PATENT DOCUMENTS

| | | | |
|---|---|---|---|
| 9,606,907 B2* | 3/2017 | Lee | G11C 8/12 |
| 9,858,972 B1* | 1/2018 | Kim | G11C 7/109 |
| 2007/0171759 A1* | 7/2007 | Cheon | G11C 29/12015 365/230.08 |
| 2008/0239840 A1* | 10/2008 | Park | G11C 8/14 365/189.17 |
| 2014/0325105 A1* | 10/2014 | Prete | G06F 13/1642 710/112 |
| 2016/0342539 A1* | 11/2016 | Bains | H05K 999/99 |
| 2020/0135248 A1* | 4/2020 | Kim | G11C 8/12 |
| 2020/0185025 A1* | 6/2020 | Kim | G11C 11/4076 |
| 2020/0379680 A1* | 12/2020 | Kim | G06F 3/0679 |

FOREIGN PATENT DOCUMENTS

KR 100443910 B1 8/2004

* cited by examiner

*Primary Examiner* — Khamdan N. Alrobaie
(74) *Attorney, Agent, or Firm* — William Park & Associates Ltd.

(57) ABSTRACT

A semiconductor device includes: a command generation circuit configured to generate a write strobe signal; a pipe control circuit configured to generate first to fourth input control signals and first to fourth output control signals which are sequentially enabled, when first and second write command pulses are inputted, and generate first to fourth internal output control signals after a preset period; and an address processing circuit configured to latch an address inputted through a command address, when the write strobe signal and the first to fourth input control signals are inputted, generate a bank group address and a column address from the latched address, when the first to fourth output control signals are inputted, and generate the bank group address and the column address by inverting the latched address, when the first to fourth internal output control signals are inputted.

29 Claims, 18 Drawing Sheets

FIG. 4

| OPERATION | CLK | CS | CA<1> | CA<2> | CA<3> | CA<4> |
|---|---|---|---|---|---|---|
| WRITE16 | Rising | H | L | H | H | X |
| | Falling | X | BG_ADD<1> | BG_ADD<2> | COL_ADD<1> | COL_ADD<2> |
| WRITE32 | Rising | H | L | L | H | L |
| | Falling | X | BG_ADD<1> | BG_ADD<2> | COL_ADD<1> | COL_ADD<2> |
| READ16 | Rising | H | H | L | L | X |
| | Falling | X | BG_ADD<1> | BG_ADD<2> | COL_ADD<1> | COL_ADD<2> |
| READ32 | Rising | H | H | L | H | X |
| | Falling | X | BG_ADD<1> | BG_ADD<2> | COL_ADD<1> | COL_ADD<2> |

SEMICONDUCTOR SYSTEM AND SEMICONDUCTOR DEVICE

CROSS-REFERENCE TO RELATED APPLICATION

The present application claims priority under 35 U.S.C. § 119(a) to Korean Patent Application No. 10-2019-0168081 filed on Dec. 16, 2019 in the Korean Intellectual Property Office, which is incorporated herein by reference in its entirety.

BACKGROUND

1. Technical Field

Embodiments of the disclosure may generally relate to a semiconductor system and a semiconductor device which performs a column operation.

2. Related Art

In general, a semiconductor device such as a DRAM includes a plurality of bank groups which are configured by cell arrays to be accessed by the same addresses. Each bank group may be realized to include a plurality of banks. The semiconductor device performs a column operation of selecting one among the plurality of bank groups and outputting data stored in a cell array included in the selected bank group by loading the data on input/output lines.

SUMMARY

In an embodiment, a semiconductor device may include a command generation circuit configured to generate a write strobe signal including a pulse which is generated depending on a combination of a chip select signal and a command address in synchronization with a clock. The semiconductor device may also include a pipe control circuit configured to generate first to fourth input control signals and first to fourth output control signals which are sequentially enabled, in the case where first and second write command pulses are inputted, and generate first to fourth internal output control signals after a preset period. The semiconductor device may further include an address processing circuit configured to latch an address inputted through the command address, in the case where the write strobe signal and the first to fourth input control signals are inputted, generate a bank group address and a column address from the latched address, in the case where the first to fourth output control signals are inputted, and generate the bank group address and the column address by inverting the latched address, in the case where the first to fourth internal output control signals are inputted.

In an embodiment, a semiconductor device may include a pipe control circuit configured to generate first to fourth input control signals and first to fourth output control signals which are sequentially enabled, in the case where a first write command pulse is inputted in a first burst operation, and generate the first to fourth input control signals and the first to fourth output control signals which are sequentially enabled and generate first to fourth internal output control signals after a preset period, in the case where a second write command pulse is inputted in a second burst operation. The semiconductor device may also include an address processing circuit configured to latch an address inputted through a command address, in the case where a write strobe signal and the first to fourth input control signals are inputted, generate a bank group address and a column address from the latched address, in the case where the first to fourth output control signals are inputted, and generate the bank group address and the column address by inverting the latched address, in the case where the first to fourth internal output control signals are inputted.

BRIEF DESCRIPTION OF THE DRAWINGS

FIG. 4 is a table to assist in the explanation of combinations of a chip select signal and command addresses for controlling operations of the semiconductor device in accordance with the embodiment of the disclosure.

DETAILED DESCRIPTION

Figure 1:
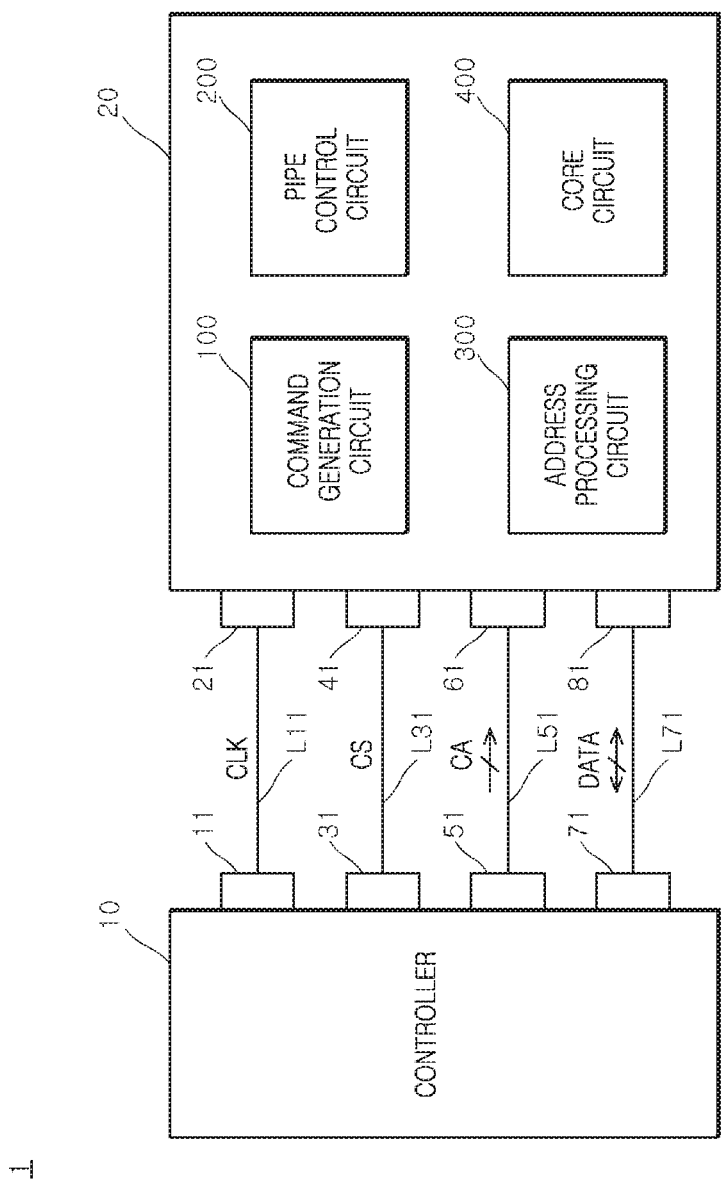
FIG. 1 is a block diagram illustrating a configuration of a semiconductor system in accordance with an embodiment of the disclosure.

The term "preset" means that the numerical value of a parameter is predetermined when the parameter is used in a process or algorithm. Depending on an embodiment, the numerical value of a parameter may be set when a process or algorithm starts or may be set during a period in which the process or algorithm is executed.

Terms such as "first" and "second" used to distinguish various components are not intended to imply a number or sequence of such components. For example, a first component may be named as a second component, and conversely, the second component may be named as the first component, meaning that the total number of components need not be two and that the second component need not follow the first component.

When it is described that one component is "coupled" or "connected" to another component, it is to be understood that the component may be coupled or connected directly or by the medium of a component. On the other hand, the descriptions of "directly coupled" and "directly connected" should be understood as one component is coupled and connected to another component directly or without intervention of a component.

"Logic high level" and "logic low level" are used to describe logic levels of signals. A signal having a "logic high level" is distinguished from a signal having a "logic low level." For example, when a signal having a first voltage corresponds to a "logic high level," a signal having a second voltage may correspond to a "logic low level." Depending on an embodiment, a "logic high level" may be set to a voltage higher than a "logic low level." Meanwhile, depending on an embodiment, logic levels of signals may be set to different logic levels or opposite logic levels. For example, depending on an embodiment, a signal having a logic high level may be set to have a logic low level, and a signal having a logic low level may be set to have a logic high level.

Various embodiments are directed to a semiconductor system and a semiconductor device which perform a column operation by generating an address for selecting a bank group, through internal inversion or non-inversion, depending on a burst operation. According to embodiments of the disclosure, a column operation may be performed by generating an address for selecting a bank group, through internal inversion or non-inversion, depending on a burst operation. Also, according to embodiments of the disclosure, by generating an address for selecting a bank group, through internal inversion, depending on a burst operation, an area may be reduced because a separate circuit for inverting an address is not needed.

Hereinafter, a semiconductor system and a semiconductor device will be described below with reference to the accompanying drawings through various examples of embodiments. These embodiments are only for illustrating the disclosure, and the scope of protection of the disclosure is not limited by these embodiments.

In an LDDDR5, a bank group mode, an 8 bank mode, and a 16 bank mode may be provided. Each bank group may include a plurality of banks. For example, each bank group may include 4 banks. In the bank group mode, a column operation for 1 bank included in a bank group may be performed by one command. In the 8 bank mode, column operations for 2 banks included in each bank group may be sequentially performed by one command. In the 16 bank mode, column operations for 4 banks included in each bank group may be sequentially performed by one command.

FIG. 1 is a block diagram illustrating a representation of an example of the configuration of a semiconductor system 1 in accordance with an embodiment of the disclosure. As illustrated in FIG. 1, the semiconductor system 1 may include a controller 10 and a semiconductor device 20. The semiconductor device 20 may include a command generation circuit 100, a pipe control circuit 200, an address processing circuit 300, and a core circuit 400.

The controller 10 may include a first control pin 11, a second control pin 31, a third control pin 51, and a fourth control pin 71. The semiconductor device 20 may include a first semiconductor pin 21, a second semiconductor pin 41, a third semiconductor pin 61, and a fourth semiconductor pin 81. A first transmission line L11 may be coupled between the first control pin 11 and the first semiconductor pin 21. A second transmission line L31 may be coupled between the second control pin 31 and the second semiconductor pin 41. A third transmission line L51 may be coupled between the third control pin 51 and the third semiconductor pin 61. A fourth transmission line L71 may be coupled between the fourth control pin 71 and the fourth semiconductor pin 81. The controller 10 may transmit a clock CLK to the semiconductor device 20 through the first transmission line L11 to control the semiconductor device 20. The controller 10 may transmit a chip select signal CS to the semiconductor device 20 through the second transmission line L31 to control the semiconductor device 20. The controller 10 may transmit a command address CA to the semiconductor device 20 through the third transmission line L51 to control the semiconductor device 20. The controller 10 and the semiconductor device 20 may transmit and receive data DATA through the fourth transmission line L71.

The command generation circuit 100 may generate a write strobe signal WT_LAT (see FIG. 2) and a read strobe signal RD_LAT (see FIG. 2) for performing a column operation, depending on the chip select signal CS and the command address CA in synchronization with the clock CLK. The command generation circuit 100 may generate a mode signal BL32 (see FIG. 2) for controlling a first burst operation and a second burst operation. The write strobe signal WT_LAT and the read strobe signal RD_LAT may be set as signals for strobing an address inputted through the command address CA in the column operation. The first burst operation may be set as an operation in which 16-bit data DATA is inputted/outputted through one column operation. The second burst operation may be set as an operation in which 32-bit data DATA is inputted/outputted through one column operation. The mode signal BL32 may be set as a signal which is enabled in the second burst operation.

In the first burst operation, the pipe control circuit 200 may generate first to fourth input control signals PIN<1:4> (see FIG. 2) and first to fourth output control signals POUT<1:4> (see FIG. 2) which are sequentially enabled, in the case where a first write command pulse EWT1 (see FIG. 2) is inputted. In the second burst operation, the pipe control circuit 200 may generate the first to fourth input control signals PIN<1:4> and the first to fourth output control signals POUT<1:4> which are sequentially enabled and may generate first to fourth internal output control signals IPOUT<1:4> (see FIG. 2) after a preset period, in the case where a second write command pulse EWT2 (see FIG. 2) is inputted. In the first burst operation, the pipe control circuit 200 may generate the first to fourth input control signals PIN<1:4> and the first to fourth output control signals POUT<1:4> which are sequentially enabled, in the case where a first read command pulse ERD1 (see FIG. 2) is inputted. In the second burst operation, the pipe control circuit 200 may generate the first to fourth input control signals PIN<1:4> and the first to fourth output control signals POUT<1:4> which are sequentially enabled and may generate the first to fourth internal output control signals IPOUT<1:4> after the preset period, in the case where a second read command pulse ERD2 (see FIG. 2) is inputted. The preset period may be set as a time for performing one column operation.

The address processing circuit 300 may latch an address inputted through the command address CA, in the case where each of the write strobe signal WT_LAT and the read strobe signal RD_LAT and the first to fourth input control signals PIN<1:4> are inputted. The address processing circuit 300 may generate first to fourth bank group addresses BG<1:4> (see FIG. 2) and first to fourth column addresses CADD<1:4> (see FIG. 2) from the latched address, in the case where the first to fourth output control signals POUT<1:4> are inputted. The address processing circuit 300 may generate the first to fourth bank group addresses BG<1:4> and the first to fourth column addresses CADD<1:4> by inverting the latched address, in the case where the first to fourth internal output control signals IPOUT<1:4> are inputted.

The core circuit 400 may include a plurality of bank groups. The core circuit 400 may input/output data DATA by performing a column operation for a bank group selected by the first to fourth bank group addresses BG<1:4> and the first to fourth column addresses CADD<1:4>.

Figure 2:
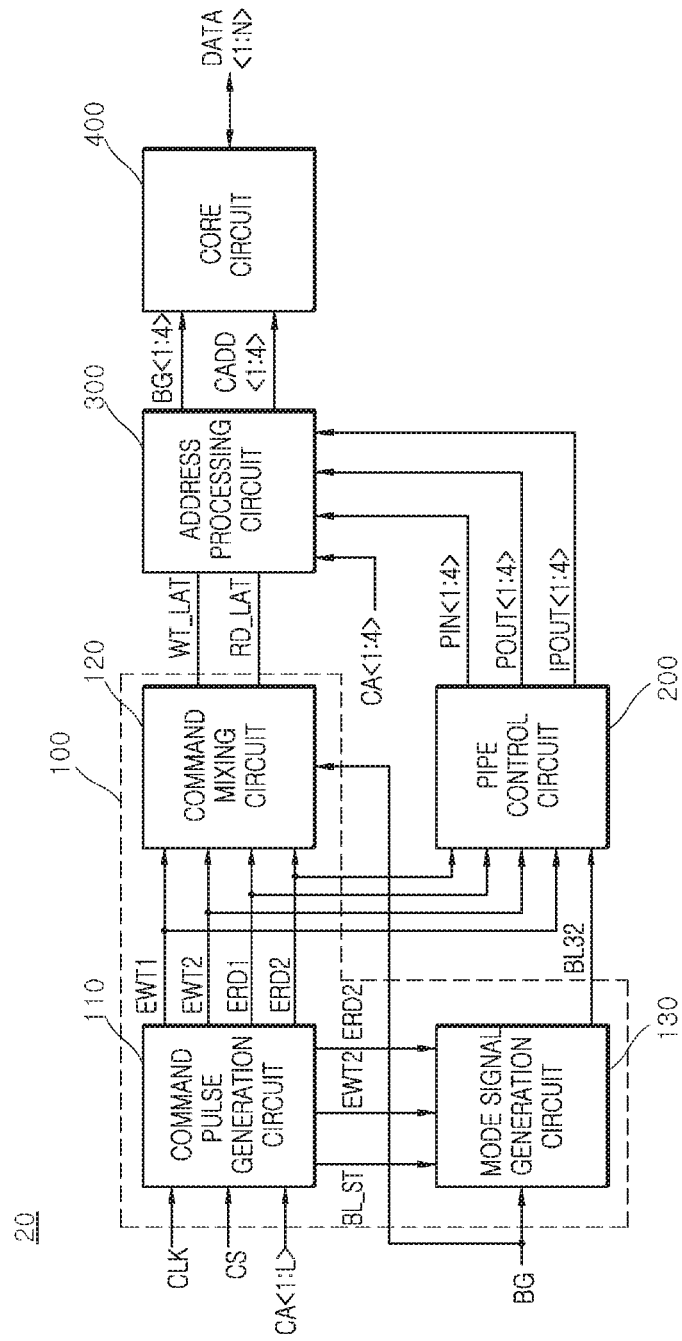
FIG. 2 is a block diagram illustrating a configuration of a semiconductor device included in the semiconductor system illustrated in FIG. 1.

FIG. 2 is a block diagram illustrating a configuration of the semiconductor device 20 in accordance with the embodiment. As illustrated in FIG. 2, the semiconductor device 20 may include the command generation circuit 100, the pipe control circuit 200, the address processing circuit 300, and the core circuit 400.

The command generation circuit 100 may include a command pulse generation circuit 110, a command mixing circuit 120, and a mode signal generation circuit 130.

The command pulse generation circuit 110 may generate the first write command pulse EWT1 and the second write command pulse EWT2 based on the chip select signal CS and first to L^th command addresses CA<1:L> in synchronization with the clock CLK. The command pulse generation circuit 110 may generate the first write command pulse EWT1 and the second write command pulse EWT2 depending on a combination of the chip select signal CS and the first to L^th command addresses CA<1:L> in synchronization with the clock CLK. The command pulse generation circuit 110 may generate the first read command pulse ERD1 and the second read command pulse ERD2 based on the chip select signal CS and the first to L^th command addresses CA<1:L> in synchronization with the clock CLK. The command pulse generation circuit 110 may generate the first read command pulse ERD1 and the second read command pulse ERD2 depending on a combination of the chip select signal CS and the first to L^th command addresses CA<1:L> in synchronization with the clock CLK. The command pulse generation circuit 110 may generate a burst signal BL_ST based on a bank group setting signal BG, the second write command pulse EWT2, and the second read command pulse ERD2. Logic level combinations of the chip select signal CS and the first to L^th command addresses CA<1:L> for generating the first write command pulse EWT1, the second write command pulse EWT2, the first read command pulse ERD1, and the second read command pulse ERD2 will be described later in detail with reference to FIG. 4. The bank group setting signal BG may be set as a signal which is enabled in the bank group mode and the 16 bank mode.

The command mixing circuit 120 may generate the write strobe signal WT_LAT based on the bank group setting signal BG, the first write command pulse EWT1, and the second write command pulse EWT2. The command mixing circuit 120 may output any one of the first write command pulse EWT1 and the second write command pulse EWT2 as the write strobe signal WT_LAT by the bank group setting signal BG. The command mixing circuit 120 may generate the read strobe signal RD_LAT based on the bank group setting signal BG, the first read command pulse ERD1, and the second read command pulse ERD2. The command mixing circuit 120 may output any one of the first read command pulse ERD1 and the second read command pulse ERD2 as the read strobe signal RD_LAT based on the bank group setting signal BG.

The mode signal generation circuit 130 may generate the mode signal BL32 based on the bank group setting signal BG, the burst signal BL_ST, the second write command pulse EWT2, and the second read command pulse ERD2. The mode signal BL32 may be set as a signal which is enabled in the second burst operation.

The command generation circuit 100 may generate the first write command pulse EWT1 and the second write command pulse EWT2 which include pulses generated depending on a combination of the chip select signal CS and the first to L^th command addresses CA<1:L> in synchronization with the clock CLK. The command generation circuit 100 may generate the first read command pulse ERD1 and the second read command pulse ERD2 which include pulses generated depending on a combination of the chip select signal CS and the first to L^th command addresses CA<1:L> in synchronization with the clock CLK. The command generation circuit 100 may generate the write strobe signal WT_LAT based on the bank group setting signal BG, the first write command pulse EWT1 and the second write command pulse EWT2. The command generation circuit 100 may generate the read strobe signal RD_LAT based on the bank group setting signal BG, the first read command pulse ERD1, and the second read command pulse ERD2. The command generation circuit 100 may generate the mode signal BL32 based on the bank group setting signal BG, the second write command pulse EWT2, and the second read command pulse ERD2.

In the first burst operation, the pipe control circuit 200 may generate the first to fourth input control signals PIN<1:4> and the first to fourth output control signals POUT<1:4> which are sequentially enabled, in the case where the first write command pulse EWT1 is inputted. In the second burst operation, the pipe control circuit 200 may generate the first to fourth input control signals PIN<1:4> and the first to fourth output control signals POUT<1:4> which are sequentially enabled and may generate the first to fourth internal output control signals IPOUT<1:4> after the preset period, in the case where the second write command pulse EWT2 is inputted. In the first burst operation, the pipe control circuit 200 may generate the first to fourth input control signals PIN<1:4> and the first to fourth output control signals POUT<1:4> which are sequentially enabled, in the case where the first read command pulse ERD1 is inputted. In the second burst operation, the pipe control circuit 200 may generate the first to fourth input control signals PIN<1:4> and the first to fourth output control signals POUT<1:4> which are sequentially enabled and may generate the first to fourth internal output control signals IPOUT<1:4> after the preset period, in the case where the second read command pulse ERD2 is inputted.

The address processing circuit 300 may latch an address inputted through first to fourth command addresses CA<1:4>, in the case where each of the write strobe signal WT_LAT and the read strobe signal RD_LAT and the first to fourth input control signals PIN<1:4> are inputted. The address processing circuit 300 may generate the first to fourth bank group addresses BG<1:4> and the first to fourth column addresses CADD<1:4> from the latched address, in the case where the first to fourth output control signals POUT<1:4> are inputted. The address processing circuit 300 may generate the first to fourth bank group addresses BG<1:4> and the first to fourth column addresses CADD<1:4> by inverting the latched address, in the case where the first to fourth internal output control signals IPOUT<1:4> are inputted. An address which is inputted through the first to fourth command addresses CA<1:4> to generate the first to fourth bank group addresses BG<1:4> and the first to fourth column addresses CADD<1:4> will be described later in detail with reference to FIG. 4.

The core circuit 400 may include the plurality of bank groups. The core circuit 400 may input/output first to N^th data DATA<1:N> by performing a column operation for a bank group selected based on the first to fourth bank group addresses BG<1:4> and the first to fourth column addresses CADD<1:4>. In the first burst operation, the core circuit 400 may input/output first to sixteenth data DATA<1:16> by performing a column operation for a bank group selected based on the first to fourth bank group addresses BG<1:4> and the first to fourth column addresses CADD<1:4>. In the second burst operation, the core circuit 400 may input/output first to thirty-second data DATA<1:32> by performing a column operation for a bank group selected based on the first to fourth bank group addresses BG<1:4> and the first to fourth column addresses CADD<1:4>. Data to be inputted/outputted in the first burst operation may be set as the first to sixteenth data DATA<1:16> of 16 bits. Data to be inputted/outputted in the second burst operation may be set as the first to thirty-second data DATA<1:32> of 32 bits. The bit number N of the data DATA<1:N> may be set to various bit numbers depending on an embodiment.

Figure 3:
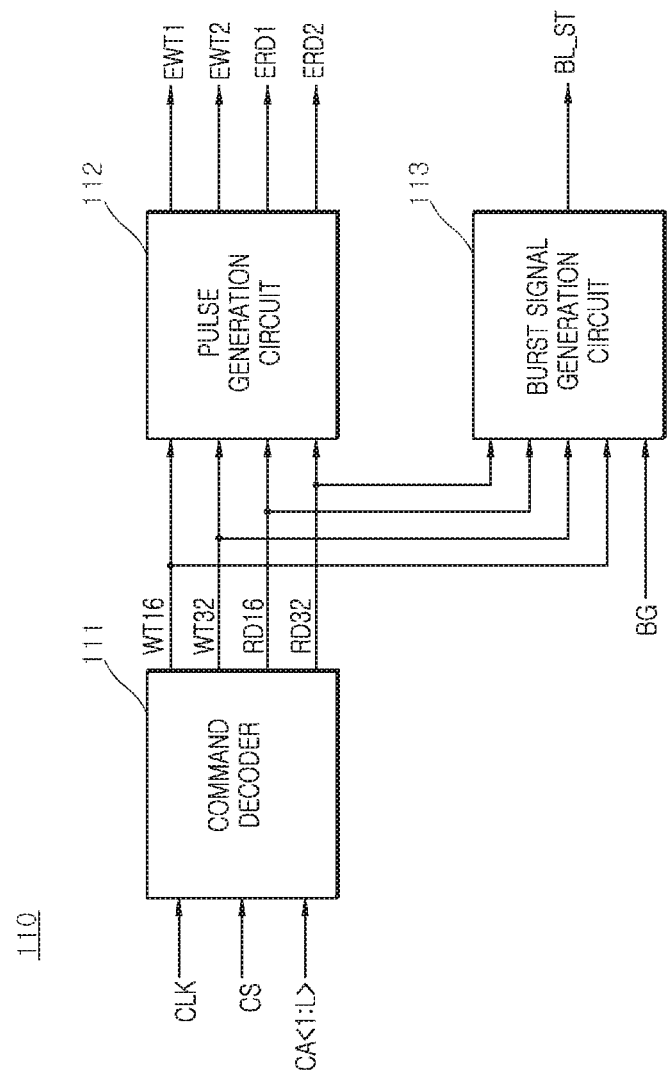
FIG. 3 is a block diagram illustrating a configuration of a command pulse generation circuit included in a command generation circuit illustrated in FIG. 2.

FIG. 3 is a block diagram illustrating a configuration of the command pulse generation circuit 110 in accordance with the embodiment. As illustrated in FIG. 3, the command pulse generation circuit 110 may include a command decoder 111, a pulse generation circuit 112, and a burst signal generation circuit 113.

The command decoder 111 may generate a first write signal WT16 which is enabled, in the case where a logic level combination of the chip select signal CS and the command addresses CA<1:L> is a first combination in synchronization with the clock CLK. The command decoder 111 may generate a second write signal WT32 which is enabled, in the case where a logic level combination of the chip select signal CS and the command addresses CA<1:L> is a second combination in synchronization with the clock CLK. The command decoder 111 may generate a first read signal RD16 which is enabled, in the case where a logic level combination of the chip select signal CS and the command addresses CA<1:L> is a third combination in synchronization with the clock CLK. The command decoder 111 may generate a second read signal RD32 which is enabled, in the case where a logic level combination of the chip select signal CS and the command addresses CA<1:L> is a fourth combination in synchronization with the clock CLK. Logic level combinations of the chip select signal CS and the command addresses CA<1:L> for generating the first write signal WT16, the second write signal WT32, the first read signal RD16 and the second read signal RD32 will be described later in detail with reference to FIG. 4.

The pulse generation circuit 112 may generate the first write command pulse EWT1 including a pulse which is generated in the case where the first write signal WT16 is inputted. The pulse generation circuit 112 may generate the second write command pulse EWT2 including a pulse which is generated in the case where the second write signal WT32 is inputted. The pulse generation circuit 112 may generate the first read command pulse ERD1 including a pulse which is generated in the case where the first read signal RD16 is inputted. The pulse generation circuit 112 may generate the second read command pulse ERD2 including a pulse which is generated in the case where the second read signal RD32 is inputted.

The burst signal generation circuit 113 may generate the burst signal BL_ST from the bank group setting signal BG, the first write signal WT16, and the second write signal WT32. The burst signal generation circuit 113 may generate the burst signal BL_ST which is enabled, in the case where the bank group setting signal BG is enabled and the first write signal WT16 is enabled. The burst signal generation circuit 113 may generate the burst signal BL_ST which is disabled, in the case where the bank group setting signal BG is enabled and the second write signal WT32 is enabled. The burst signal generation circuit 113 may generate the burst signal BL_ST from the bank group setting signal BG, the first read signal RD16, and the second read signal RD32. The burst signal generation circuit 113 may generate the burst signal BL_ST which is enabled, in the case where the bank group setting signal BG is enabled and the first read signal RD16 is enabled. The burst signal generation circuit 113 may generate the burst signal BL_ST which is disabled, in the case where the bank group setting signal BG is enabled and the second read signal RD32 is enabled. The burst signal BL_ST may be set as a signal which is enabled to a logic high level in the first burst operation. Depending on an embodiment, the burst signal BL_ST may be set as a signal which is enabled to a logic low level.

An address which is inputted through the first to fourth command addresses CA<1:4> to generate the first to fourth bank group addresses BG<1:4> and the first to fourth column addresses CADD<1:4> will be described below in detail with reference to FIG. 4.

First, an address which is inputted through the first to fourth command addresses CA<1:4> in a first burst operation WRITE16 in a write operation will be described below.

In the write operation, the first command address CA<1> which is inputted in synchronization with the falling edge of the clock CLK in the first burst operation may be set as a first bank group input address BG_ADD<1> for generating the first to fourth bank group addresses BG<1:4>. In the write operation, the second command address CA<2> which is inputted in synchronization with the falling edge of the clock CLK in the first burst operation may be set as a second bank group input address BG_ADD<2> for generating the first to fourth bank group addresses BG<1:4>. In the write operation, the third command address CA<3> which is inputted in synchronization with the falling edge of the clock CLK in the first burst operation may be set as a first column input address COL_ADD<1> for generating the first to fourth column addresses CADD<1:4>. In the write operation, the fourth command address CA<4> which is inputted in synchronization with the falling edge of the clock CLK in the first burst operation may be set as a second column input address COL_ADD<2> for generating the first to fourth column addresses CADD<1:4>.

Next, an address which is inputted through the first to fourth command addresses CA<1:4> in a second burst operation WRITE32 in the write operation will be described below.

In the write operation, the first command address CA<1> which is inputted in synchronization with the falling edge of the clock CLK in the second burst operation may be set as the first bank group input address BG_ADD<1> for generating the first to fourth bank group addresses BG<1:4>. In the write operation, the second command address CA<2> which is inputted in synchronization with the falling edge of the clock CLK in the second burst operation may be set as the second bank group input address BG_ADD<2> for generating the first to fourth bank group addresses BG<1:4>. In the write operation, the third command address CA<3> which is inputted in synchronization with the falling edge of the clock CLK in the second burst operation may be set as the first column input address COL_ADD<1> for generating the first to fourth column addresses CADD<1:4>. In the write operation, the fourth command address CA<4> which is inputted in synchronization with the falling edge of the clock CLK in the second burst operation may be set as the second column input address COL_ADD<2> for generating the first to fourth column addresses CADD<1:4>.

Next, an address which is inputted through the first to fourth command addresses CA<1:4> in a first burst operation READ16 in a read operation will be described below.

In the read operation, the first command address CA<1> which is inputted in synchronization with the falling edge of the clock CLK in the first burst operation may be set as the first bank group input address BG_ADD<1> for generating the first to fourth bank group addresses BG<1:4>. In the read operation, the second command address CA<2> which is inputted in synchronization with the falling edge of the clock CLK in the first burst operation may be set as the second bank group input address BG_ADD<2> for generating the first to fourth bank group addresses BG<1:4>. In the read operation, the third command address CA<3> which is inputted in synchronization with the falling edge of the clock CLK in the first burst operation may be set as the first column input address COL_ADD<1> for generating the first to fourth column addresses CADD<1:4>, In the read operation, the fourth command address CA<4> which is inputted in synchronization with the falling edge of the clock CLK in the first burst operation may be set as the second column input address COL_ADD<2> for generating the first to fourth column addresses CADD<1:4>.

Next, an address which is inputted through the first to fourth command addresses CA<1:4> in a second burst operation READ32 in the read operation will be described below.

In the read operation, the first command address CA<1> which is inputted in synchronization with the falling edge of the clock CLK in the second burst operation may be set as the first bank group input address BG_ADD<1> for generating the first to fourth bank group addresses BG<1:4>. In the read operation, the second command address CA<2> which is inputted in synchronization with the falling edge of the clock CLK in the second burst operation may be set as the second bank group input address BG_ADD<2> for generating the first to fourth bank group addresses BG<1:4>. In the read operation, the third command address CA<3> which is inputted in synchronization with the falling edge of the clock CLK in the second burst operation may be set as the first column input address COL_ADD<1> for generating the first to fourth column addresses CADD<1:4>. In the read operation, the fourth command address CA<4> which is inputted in synchronization with the falling edge of the clock CLK in the second burst operation may be set as the second column input address COL_ADD<2> for generating the first to fourth column addresses CADD<1:4>.

The disclosure describes that the first to fourth bank group addresses BG<1:4> of 4 bits and the first to fourth column addresses CADD<1:4> of 4 bits are generated. However, it is to be noted that, depending on an embodiment, the disclosure may be realized in such a manner that bank group addresses including a plurality of bits and column addresses including a plurality of bits are generated.

Logic level combinations of the chip select signal CS and the command addresses CA<1:L> for performing the first burst operation and the second burst operation will be described below in detail with reference to FIG. 4.

First, the first combination of the chip select signal CS and the command addresses CA<1:L> for performing the first burst operation WRITE16 in the write operation will be described below in detail.

The first combination of the chip select signal CS and the command addresses CA<1:L> means that the chip select signal CS inputted in synchronization with the rising edge of the clock CLK is a logic high level H, the first command address CA<1> is a logic low level L, the second command address CA<2> is a logic high level H, and the third command address CA<3> is a logic high level H.

Next, the second combination of the chip select signal CS and the command addresses CA<1:L> for performing the second burst operation WRITE32 in the write operation will be described below in detail.

The second combination of the chip select signal CS and the command addresses CA<1:L> means that the chip select signal CS inputted in synchronization with the rising edge of the clock CLK is a logic high level H, the first command address CA<1> is a logic low level L, the second command address CA<2> is a logic low level L, the third command address CA<3> is a logic high level H, and the fourth command address CA<4> is a logic low level L.

Next, the third combination of the chip select signal CS and the command addresses CA<1:L> for performing the first burst operation READ16 in the read operation will be described below in detail.

The third combination of the chip select signal CS and the command addresses CA<1:L> means that the chip select signal CS inputted in synchronization with the rising edge of the clock CLK is a logic high level H, the first command address CA<1> is a logic high level H, the second command address CA<2> is a logic low level L, and the third command address CA<3> is a logic low level L.

Next, the fourth combination of the chip select signal CS and the command addresses CA<1:L> for performing the second burst operation READ32 in the read operation will be described below in detail.

The fourth combination of the chip select signal CS and the command addresses CA<1:L> means that the chip select signal CS inputted in synchronization with the rising edge of the clock CLK is a logic high level H, the first command address CA<1> is a logic high level H, the second command address CA<2> is a logic low level L, and the third command address CA<3> is a logic high level H.

Figure 5:
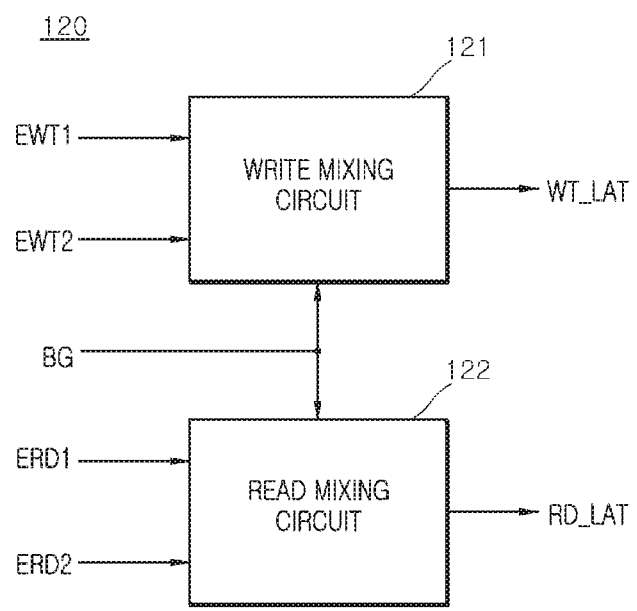
FIG. 5 is a block diagram illustrating a configuration of a command mixing circuit included in the command generation circuit illustrated in FIG. 2.

FIG. 5 is a block diagram illustrating a configuration of the command mixing circuit 120 in accordance with the embodiment. As illustrated in FIG. 5, the command mixing circuit 120 may include a write mixing circuit 121 and a read mixing circuit 122.

The write mixing circuit 121 may generate the write strobe signal WT_LAT by mixing the first write command pulse EWT1 and the second write command pulse EWT2 based on the bank group setting signal BG. The write mixing circuit 121 may output any one of the first write command pulse EWT1 and the second write command pulse EWT2 as the write strobe signal WT_LAT based on the bank group setting signal BG.

The read mixing circuit 122 may generate the read strobe signal RD_LAT by mixing the first read command pulse ERD1 and the second read command pulse ERD2 based on the bank group setting signal BG. The read mixing circuit 122 may output any one of the first read command pulse ERD1 and the second read command pulse ERD2 as the read strobe signal RD_LAT based on the bank group setting signal BG.

Figure 6:
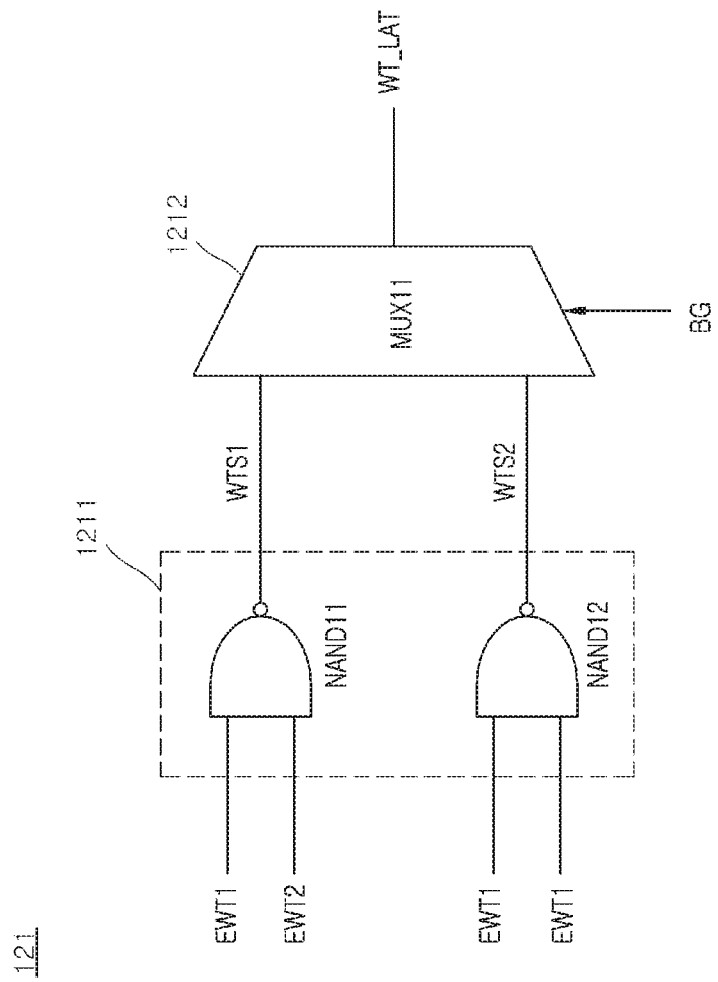
FIG. 6 is a diagram illustrating a configuration of a write mixing circuit included in the command mixing circuit illustrated in FIG. 5.

FIG. 6 is a diagram illustrating a configuration of the write mixing circuit 121 in accordance with the embodiment. As illustrated in FIG. 6, the write mixing circuit 121 may include a write mixing signal generation circuit 1211 and a first selective transfer circuit 1212.

The write mixing signal generation circuit 1211 may be realized by NAND gates NAND11 and NAND12. The write mixing signal generation circuit 1211 may generate a first write mixing signal WTS1 by mixing the first write command pulse EWT1 and the second write command pulse EWT2. The write mixing signal generation circuit 1211 may generate a second write mixing signal WTS2 from the first write command pulse EWT1. The write mixing signal generation circuit 1211 may generate the first write mixing signal WTS1 by performing a NAND logic operation on the first write command pulse EWT1 and the second write command pulse EWT2. The write mixing signal generation circuit 1211 may generate the second write mixing signal WTS2 by performing a NAND logic operation on the first write command pulse EWT1 and the first write command pulse EWT1.

The first selective transfer circuit 1212 may be realized by a multiplexer MUX11. The first selective transfer circuit 1212 may output any one of the first write mixing signal WTS1 and the second write mixing signal WTS2 as the write strobe signal WT_LAT based on the bank group setting signal BG. The first selective transfer circuit 1212 may output the first write mixing signal WTS1 as the write strobe signal WT_LAT in the case where the bank group setting signal BG is enabled. The first selective transfer circuit 1212 may output the second write mixing signal WTS2 as the write strobe signal WT_LAT in the case where the bank group setting signal BG is disabled.

Figure 7:
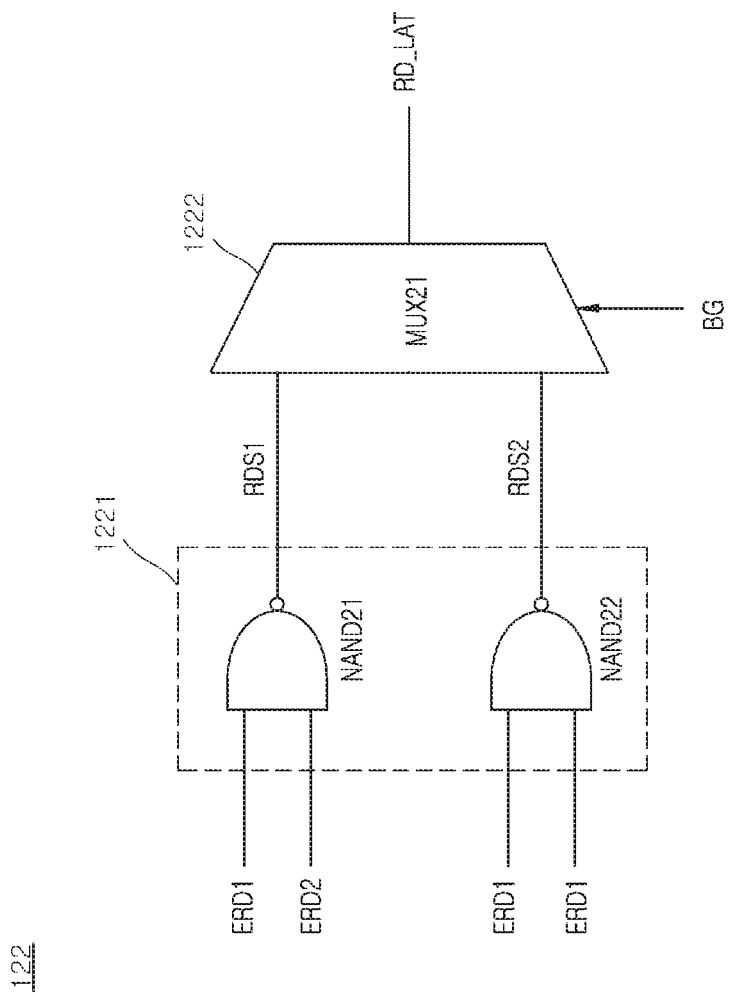
FIG. 7 is a diagram illustrating a configuration of a read mixing circuit included in the command mixing circuit illustrated in FIG. 5.

FIG. 7 is a diagram illustrating a configuration of the read mixing circuit 122 in accordance with the embodiment. As illustrated in FIG. 7, the read mixing circuit 122 may include a read mixing signal generation circuit 1221 and a second selective transfer circuit 1222.

The read mixing signal generation circuit 1221 may be realized by NAND gates NAND21 and NAND22. The read mixing signal generation circuit 1221 may generate a first read mixing signal RDS1 by mixing the first read command pulse ERD1 and the second read command pulse ERD2. The read mixing signal generation circuit 1221 may generate a second read mixing signal RDS2 from the first read command pulse ERD1. The read mixing signal generation circuit 1221 may generate the first read mixing signal RDS1 by performing a NAND logic operation on the first read command pulse ERD1 and the second read command pulse ERD2, The read mixing signal generation circuit 1221 may generate the second read mixing signal RDS2 by performing a NAND logic operation on the first read command pulse ERD1 and the first read command pulse ERD1.

The second selective transfer circuit 1222 may be realized by a multiplexer MUX21. The second selective transfer circuit 1222 may output any one of the first read mixing signal RDS1 and the second read mixing signal RDS2 as the read strobe signal RD_LAT based on the bank group setting signal BG. The second selective transfer circuit 1222 may output the first read mixing signal RDS1 as the read strobe signal RD_LAT in the case where the bank group setting signal BG is enabled. The second selective transfer circuit 1222 may output the second read mixing signal RDS2 as the read strobe signal RD_LAT in the case where the bank group setting signal BG is disabled.

Figure 8:
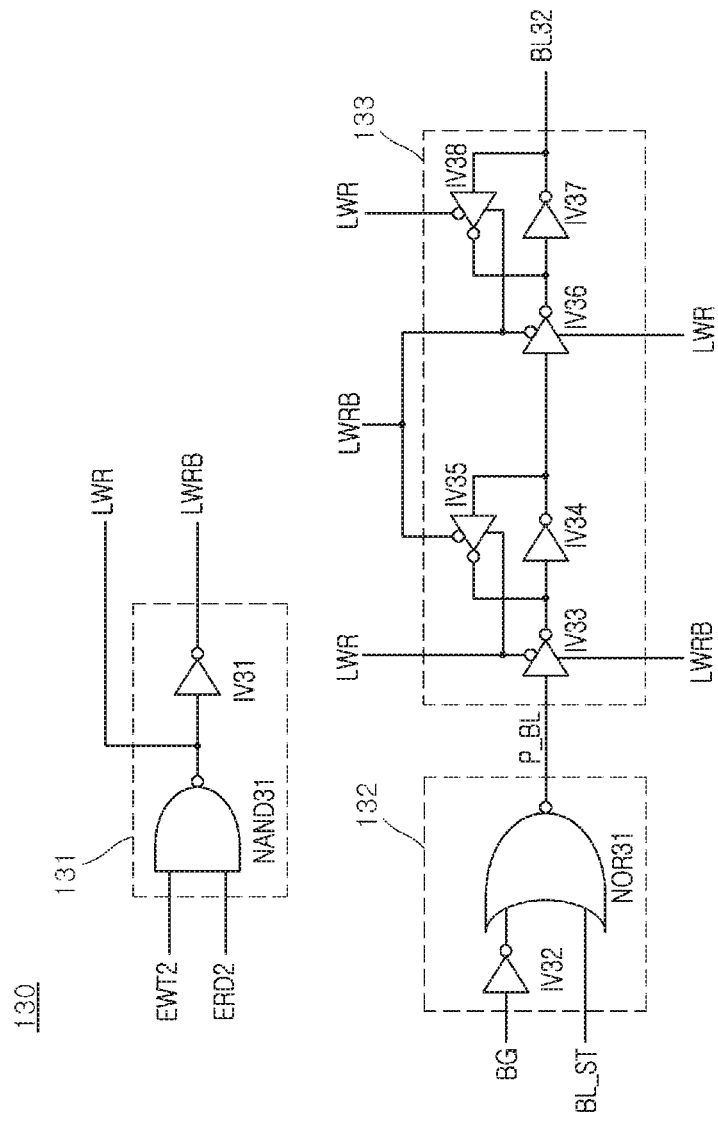
FIG. 8 is a circuit diagram illustrating a configuration of a mode signal generation circuit included in the command generation circuit illustrated in FIG. 2.

FIG. 8 is a circuit diagram illustrating a configuration of the mode signal generation circuit 130 in accordance with the embodiment. As illustrated in FIG. 8, the mode signal generation circuit 130 may include a latch control signal generation circuit 131, a pre-mode signal generation circuit 132, and a latch circuit 133.

The latch control signal generation circuit 131 may be realized by a NAND gate NAND31 and an inverter IV31. The latch control signal generation circuit 131 may generate a latch control signal LWR by performing a NAND logic operation on the second write command pulse EWT2 and the second read command pulse ERD2. The latch control signal generation circuit 131 may generate an inverted latch control signal LWRB by inverting and buffering the latch control signal LWR.

The pre-mode signal generation circuit 132 may be realized by an inverter IV32 and a NOR gate NOR31. The pre-mode signal generation circuit 132 may generate a pre-mode signal P_BL based on the bank group setting signal BG and the burst signal BL_ST. The pre-mode signal generation circuit 132 may generate the pre-mode signal P_BL which is enabled to a logic high level, in the case where the bank group setting signal BG is enabled to a logic high level and the burst signal BL_ST is disabled to a logic low level.

The latch circuit 133 may be realized by inverters IV33, IV34, IV35, IV36, IV37, and IV38. The latch circuit 133 may latch the pre-mode signal P_BL based on the latch control signal LWR and the inverted latch control signal LWRB. The latch circuit 133 may generate the mode signal BL32 by buffering the latched pre-mode signal P_BL by the latch control signal LWR and the inverted latch control signal LWRB. The latch circuit 133 may receive and latch the pre-mode signal P_BL in the case where the latch control signal LWR is a logic low level and the inverted latch control signal LWRB is a logic high level. The latch circuit 133 may generate the mode signal BL32 by buffering the latched pre-mode signal P_BL in the case where the latch control signal LWR is a logic high level and the inverted latch control signal LWRB is a logic low level.

Figure 9:
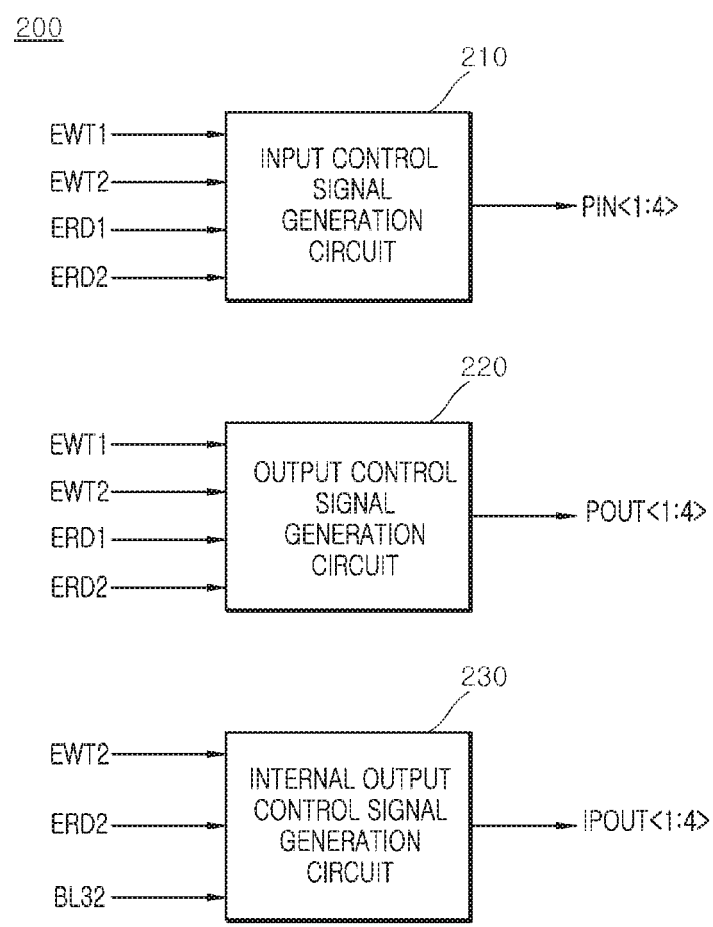
FIG. 9 is a block diagram illustrating a configuration of a pipe control circuit included in the semiconductor device illustrated in FIG. 2.

FIG. 9 is a block diagram illustrating a configuration of the pipe control circuit 200 in accordance with the embodiment. As illustrated in FIG. 9, the pipe control circuit 200 may include an input control signal generation circuit 210, an output control signal generation circuit 220, and an internal output control signal generation circuit 230.

The input control signal generation circuit 210 may generate the first to fourth input control signals PIN<1:4> which are sequentially enabled, in the case where any one of the first write command pulse EWT1 and the second write command pulse EWT2 is inputted. The input control signal generation circuit 210 may generate the first to fourth input control signals PIN<1:4> which are sequentially enabled, in the case where any one of the first read command pulse ERD1 and the second read command pulse ERD2 is inputted. The input control signal generation circuit 210 may be realized in such a manner that the first input control signal PIN<1> is enabled after the fourth input control signal PIN<4> is enabled. The input control signal generation circuit 210 is realized to generate the first to fourth input control signals PIN<1:4> of 4 bits, but may be realized to generate input control signals of various bits depending on an embodiment.

The output control signal generation circuit 220 may generate the first to fourth output control signals POUT<1:4> which are sequentially enabled, in the case where any one of the first write command pulse EWT1 and the second write command pulse EWT2 is inputted. The output control signal generation circuit 220 may generate the first to fourth output control signals POUT<1:4> which are sequentially enabled, in the case where any one of the first read command pulse ERD1 and the second read command pulse ERD2 is inputted. The output control signal generation circuit 220 may be realized in such a manner that the first output control signal POUT<1> is enabled after the fourth output control signal POUT<4> is enabled. The output control signal generation circuit 220 is realized to generate the first to fourth output control signals POUT<1:4> of 4 bits, but may be realized to generate output control signals of various bits depending on an embodiment.

The internal output control signal generation circuit 230 may generate the first to fourth internal output control signals IPOUT<1:4> which are sequentially enabled, after the preset period, based on the second write command pulse EWT2 and the mode signal BL32. The internal output control signal generation circuit 230 may generate the first to fourth internal output control signals IPOUT<1:4> which are sequentially enabled, after the preset period, based on the second read command pulse ERD2 and the mode signal BL32. The internal output control signal generation circuit 230 may block the generation of the first to fourth internal output control signals IPOUT<1:4> based on the mode signal BL32. The internal output control signal generation circuit 230 may be realized in such a manner that the first internal output control signal IPOUT<1> is enabled after the fourth internal output control signal IPOUT<4> is enabled. The internal output control signal generation circuit 230 is realized to generate the first to fourth internal output control signals IPOUT<1:4> of 4 bits, but may be realized to generate internal output control signals of various bits depending on an embodiment.

Figure 10:
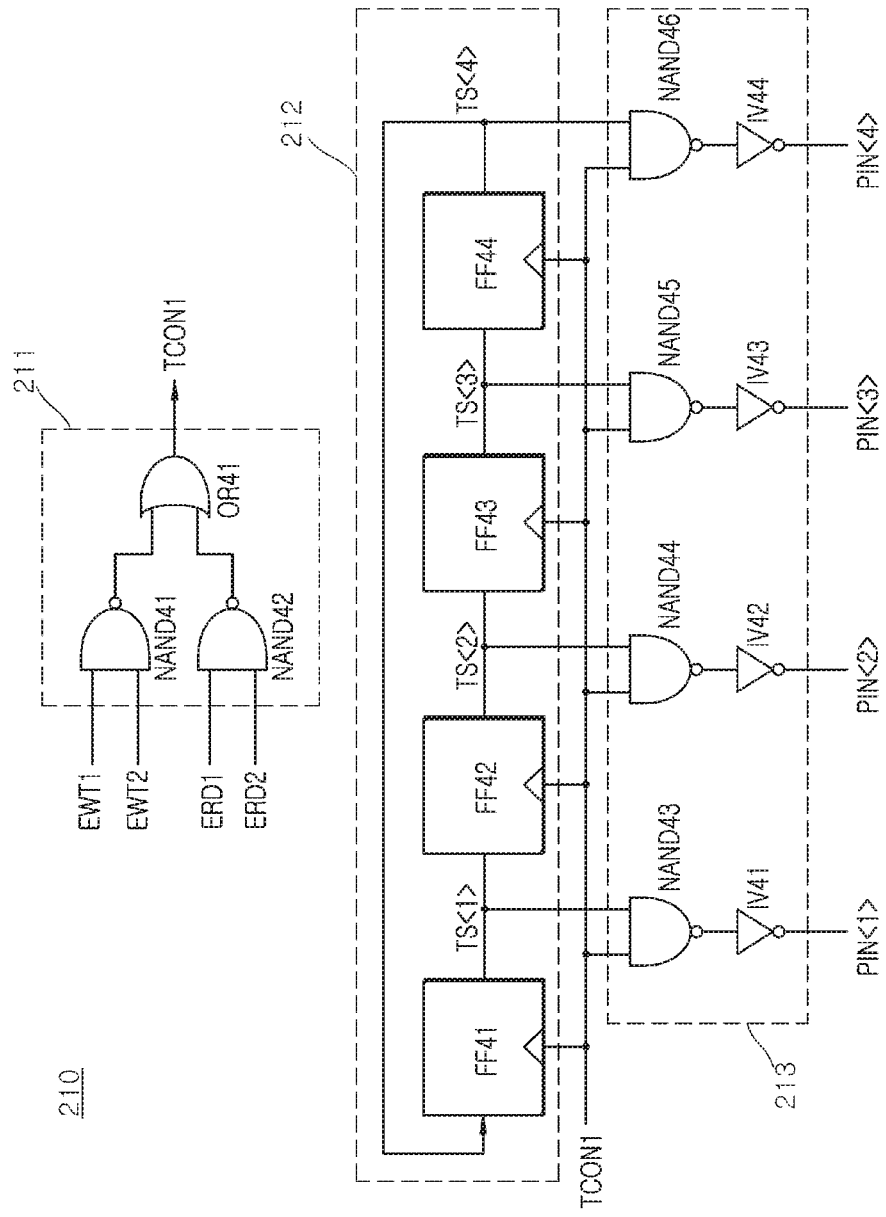
FIG. 10 is a diagram illustrating a configuration of an input control signal generation circuit included in the pipe control circuit illustrated in FIG. 9.

FIG. 10 is a diagram illustrating a configuration of the input control signal generation circuit 210 in accordance with the embodiment. As illustrated in FIG. 10, the input control signal generation circuit 210 may include a first transfer control signal generation circuit 211, a first counter 212, and a first signal transfer circuit 213.

The first transfer control signal generation circuit 211 may be realized by NAND gates NAND41 and NAND42 and an OR gate OR41. The first transfer control signal generation circuit 211 may generate a first transfer control signal TCON1 which is enabled, in the case where any one of the first write command pulse EWT1 and the second write command pulse EWT2 is inputted. The first transfer control signal generation circuit 211 may generate the first transfer control signal TCON1 which is enabled, in the case where any one of the first read command pulse ERD1 and the second read command pulse ERD2 is inputted. The first transfer control signal generation circuit 211 may generate the first transfer control signal TCON1 which is enabled to a logic high level, in the case where any one of the first write command pulse EWT1, the second write command pulse EWT2, the first read command pulse ERD1, and the second read command pulse ERD2 is inputted at a logic low level.

The first counter 212 may be realized by flip-flops FF41, FF42, FF43, and FF44. The first counter 212 may generate first to fourth transfer signals TS<1:4> which are sequentially counted, in the case where the first transfer control signal TCON1 is inputted. The first counter 212 may enable the first transfer signal TS<1> to a logic high level when the first transfer control signal TCON1 is inputted at a logic high level after the fourth transfer signal TS<4> is enabled to a logic high level.

The first signal transfer circuit 213 may be realized by NAND gates NAND43, NAND44, NAND45, and NAND46 and inverters IV41, IV42, IV43, and IV44. The first signal transfer circuit 213 may generate the first to fourth input control signals PIN<1:4> from the first to fourth transfer signals TS<1:4> in the case where the first transfer control signal TCON1 is enabled. The first signal transfer circuit 213 may generate the first to fourth input control signals PIN<1:4> by buffering the first to fourth transfer signals TS<1:4> in the case where the first transfer control signal TCON1 is enabled to a logic high level.

Figure 11:
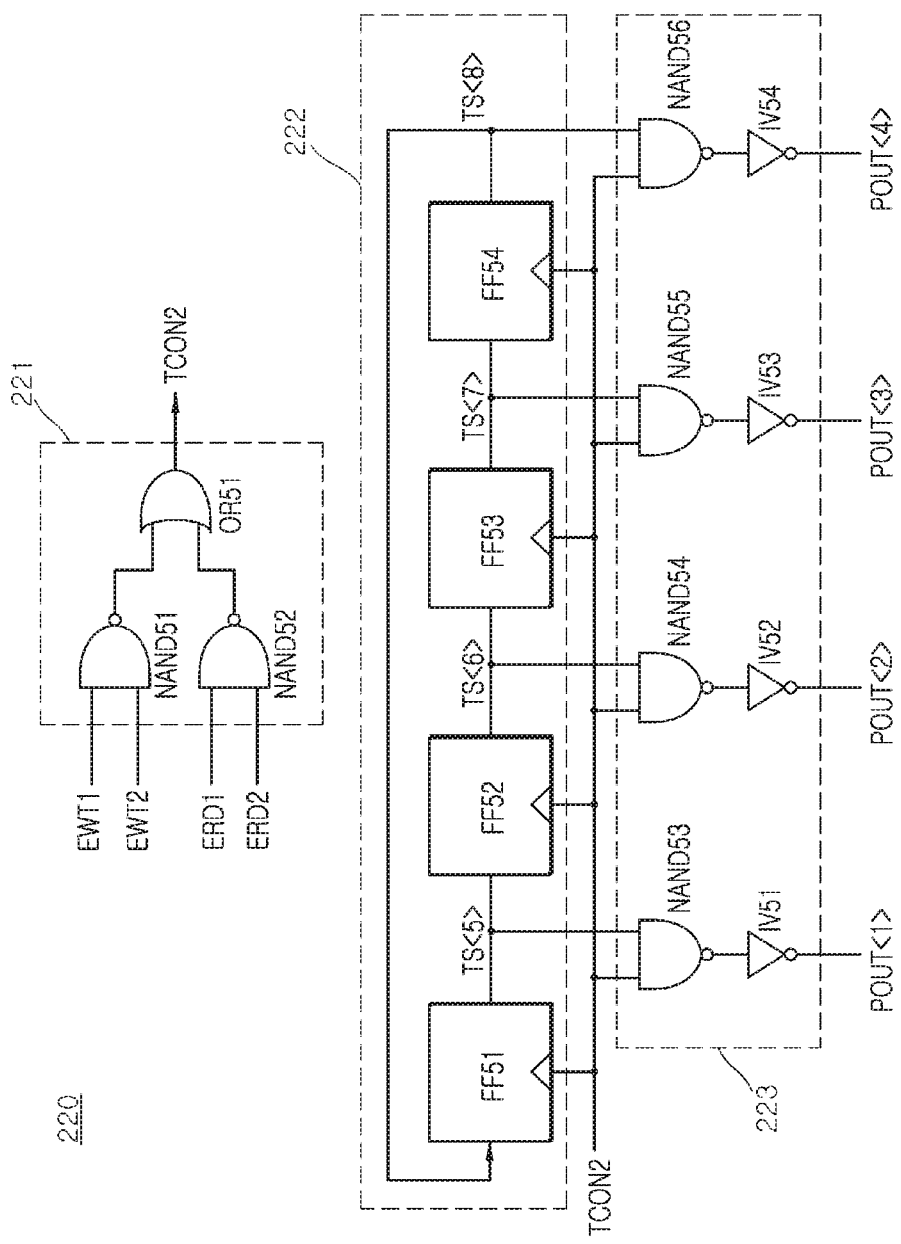
FIG. 11 is a diagram illustrating a configuration of an output control signal generation circuit included in the pipe control circuit illustrated in FIG. 9.

FIG. 11 is a diagram illustrating a configuration of the output control signal generation circuit 220 in accordance with the embodiment. As illustrated in FIG. 11, the output control signal generation circuit 220 may include a second transfer control signal generation circuit 221, a second counter 222, and a second signal transfer circuit 223.

The second transfer control signal generation circuit 221 may be realized by NAND gates NAND51 and NAND52 and an OR gate OR51. The second transfer control signal generation circuit 221 may generate a second transfer control signal TCON2 which is enabled, in the case where any one of the first write command pulse EWT1 and the second write command pulse EWT2 is inputted. The second transfer control signal generation circuit 221 may generate the second transfer control signal TCON2 which is enabled, in the case where any one of the first read command pulse ERD1 and the second read command pulse ERD2 is inputted. The second transfer control signal generation circuit 221 may generate the second transfer control signal TCON2 which is enabled to a logic high level, in the case where any one of the first write command pulse EWT1, the second write command pulse EWT2, the first read command pulse ERD1 and the second read command pulse ERD2 is inputted at a logic low level.

The second counter 222 may be realized by flip-flops FF51, FF52, FF53, and FF54. The second counter 222 may generate fifth to eighth transfer signals TS<5:8> which are sequentially counted, in the case where the second transfer control signal TCON2 is inputted. The second counter 222 may enable the fifth transfer signal TS<5> to a logic high level when the second transfer control signal TCON2 is inputted at a logic high level after the eighth transfer signal TS<8> is enabled to a logic high level.

The second signal transfer circuit 223 may be realized by NAND gates NAND53, NAND54, NAND55, and NAND56 and inverters IV51, IV52, IV53, and IV54. The second signal transfer circuit 223 may generate the first to fourth output control signals POUT<1:4> from the fifth to eighth transfer signals TS<5:8> in the case where the second transfer control signal TCON2 is enabled. The second signal transfer circuit 223 may generate the first to fourth output control signals POUT<1:4> by buffering the fifth to eighth transfer signals TS<5:8> in the case where the second transfer control signal TCON2 is enabled to a logic high level.

Figure 12:
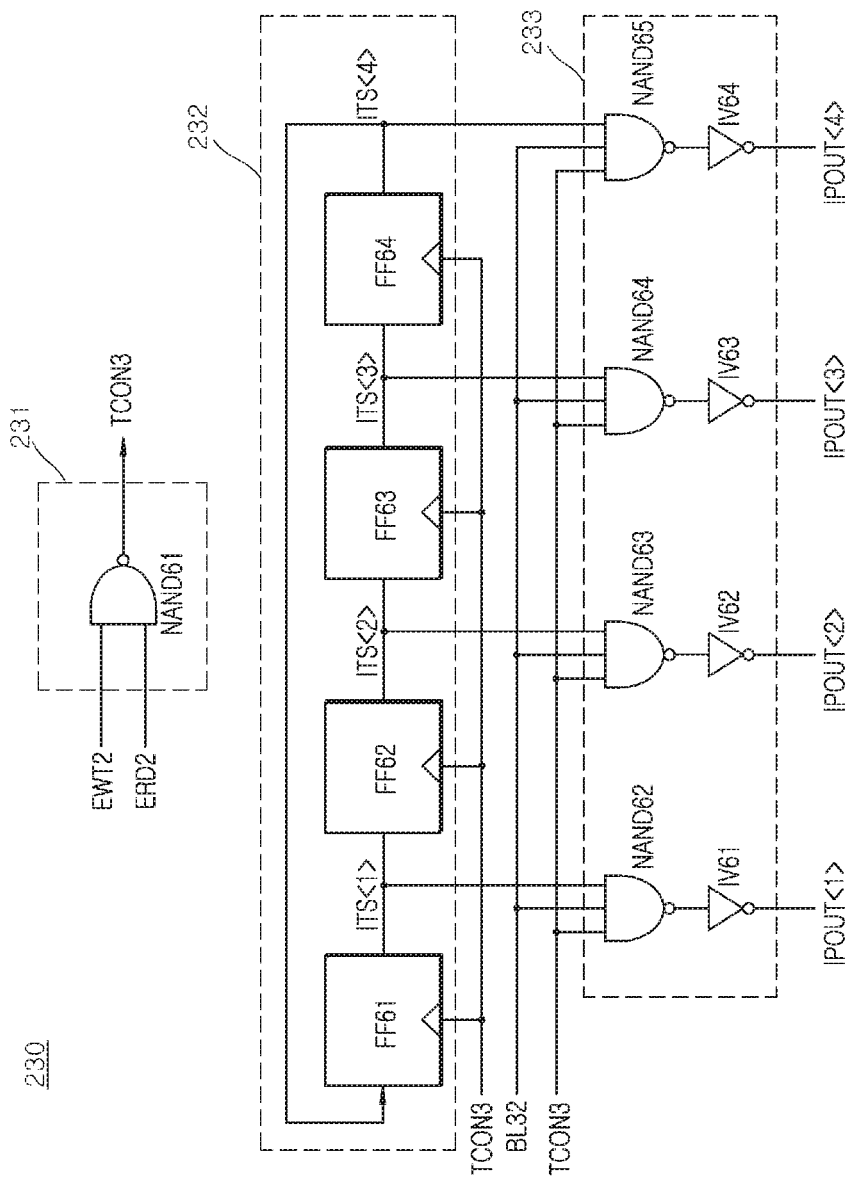
FIG. 12 is a diagram illustrating a configuration of an internal output control signal generation circuit included in the pipe control circuit illustrated in FIG. 9.

FIG. 12 is a diagram illustrating a configuration of the internal output control signal generation circuit 230 in accordance with the embodiment. As illustrated in FIG. 12, the internal output control signal generation circuit 230 may include a third transfer control signal generation circuit 231, a third counter 232, and a third signal transfer circuit 233.

The third transfer control signal generation circuit 231 may be realized by a NAND gate NAND61. The third transfer control signal generation circuit 231 may generate a third transfer control signal TCON3 which is enabled, in the case where any one of the second write command pulse EWT2 and the second read command pulse ERD2 is inputted. The third transfer control signal generation circuit 231 may generate the third transfer control signal TCON3 which is enabled to a logic high level, in the case where any one of the second write command pulse EWT2 and the second read command pulse ERD2 is inputted at a logic low level.

The third counter 232 may be realized by flip-flops FF61, FF62, FF63, and FF64. The third counter 232 may generate first to fourth internal transfer signals ITS<1:4> which are sequentially counted, in the case where the third transfer control signal TCON3 is inputted. The third counter 232 may enable the first internal transfer signal ITS<1> to a logic high level when the third transfer control signal TCON3 is inputted at a logic high level after the fourth internal transfer signal ITS<4> is enabled to a logic high level.

The third signal transfer circuit 233 may be realized by NAND gates NAND62, NAND63, NAND64, and NAND65 and inverters IV61, IV62, IV63, and IV64, The third signal transfer circuit 233 may generate the first to fourth internal output control signals IPOUT<1:4> from the first to fourth internal transfer signals ITS<1:4> in the case where the mode signal BL32 and the third transfer control signal TCON3 are enabled. The third signal transfer circuit 233 may generate the first to fourth internal output control signals IPOUT<1:4> by buffering the first to fourth internal transfer signals ITS<1:4> in the case where the mode signal BL32 and the third transfer control signal TCON3 are enabled to logic high levels. The third signal transfer circuit 233 may block the generation of the first to fourth internal output control signals IPOUT<1:4> in the case where the mode signal BL32 is disabled to a logic low level.

Figure 13:
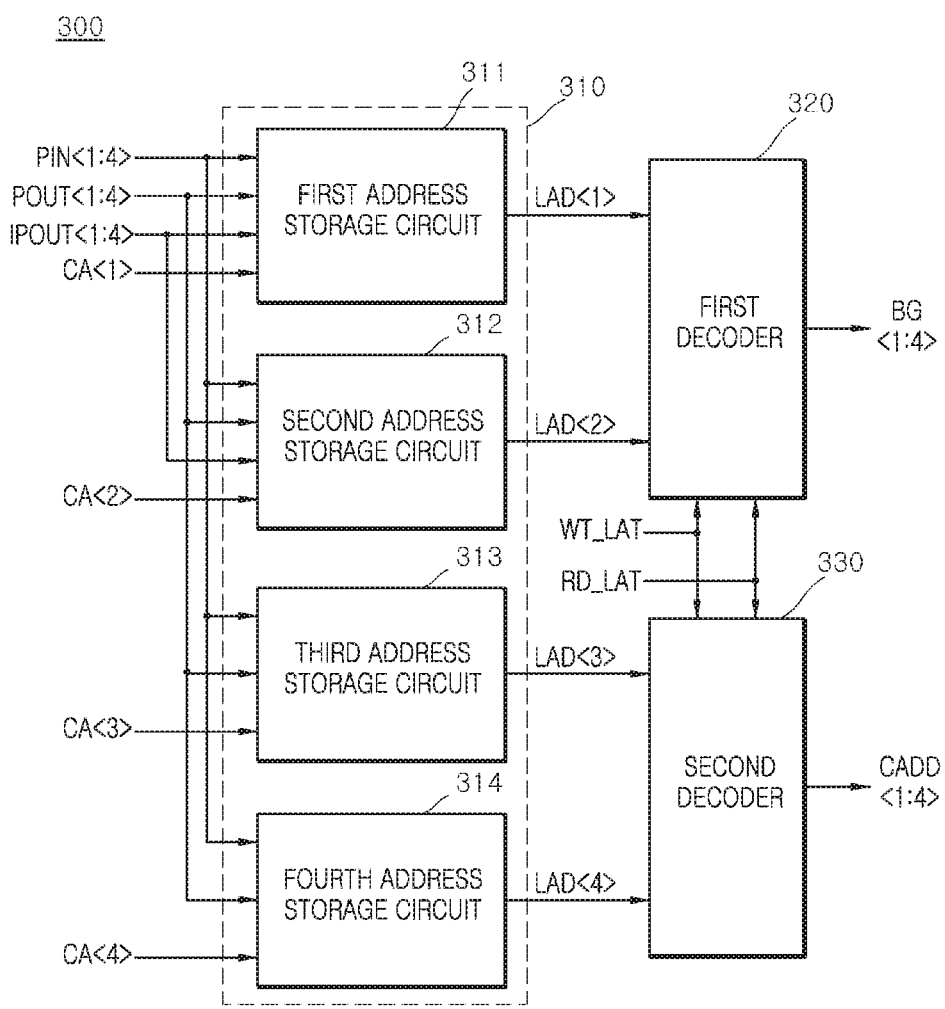
FIG. 13 is a block diagram illustrating a configuration of an address processing circuit included in the semiconductor device illustrated in FIG. 2.

FIG. 13 is a block diagram illustrating a configuration of the address processing circuit 300 in accordance with the embodiment. As illustrated in FIG. 13, the address processing circuit 300 may include a latch address generation circuit 310, a first decoder 320, and a second decoder 330.

The latch address generation circuit 310 may include a first address storage circuit 311, a second address storage circuit 312, a third address storage circuit 313, and a fourth address storage circuit 314.

The first address storage circuit 311 may latch a first address which is inputted through the first command address CA<1>, based on the first to fourth input control signals PIN<1:4>. The first address storage circuit 311 may generate a first latch address LAD<1> from the latched first address, based on the first to fourth output control signals POUT<1:4>. The first address storage circuit 311 may generate the first latch address LAD<1> by inverting and buffering the latched first address, based on the first to fourth internal output control signals IPOUT<1:4>.

The second address storage circuit 312 may latch a second address which is inputted through the second command address CA<2>, based on the first to fourth input control signals PIN<1:4>. The second address storage circuit 312 may generate a second latch address LAD<2> from the latched second address, based on the first to fourth output control signals POUT<1:4>. The second address storage circuit 312 may generate the second latch address LAD<2> by inverting and buffering the latched second address, by the first to fourth internal output control signals IPOUT<1:4>.

The third address storage circuit 313 may latch a third address which is inputted through the third command address CA<3>, based on the first to fourth input control signals PIN<1:4>. The third address storage circuit 313 may generate a third latch address LAD<3> from the latched third address, based on the first to fourth output control signals POUT<1:4>.

The fourth address storage circuit 314 may latch a fourth address which is inputted through the fourth command address CA<4>, based on the first to fourth input control signals PIN<1:4>. The fourth address storage circuit 314 may generate a fourth latch address LAD<4> from the latched fourth address, based on the first to fourth output control signals POUT<1:4>.

The latch address generation circuit 310 may latch the first to fourth addresses which are inputted through the first to fourth command addresses CA<1:4>, based on the first to fourth input control signals PIN<1:4>. The latch address generation circuit 310 may generate the first to fourth latch addresses LAD<1:4> from the latched first to fourth addresses, based on the first to fourth output control signals POUT<1:4>. The latch address generation circuit 310 may generate the first and second latch addresses LAD<1:2> by inverting and buffering the latched first and second addresses, based on the first to fourth internal output control signals IPOUT<1:4>, and may generate the third and fourth latch addresses LAD<3:4> by buffering the latched third and fourth addresses.

The first decoder 320 may generate the first to fourth bank group addresses BG<1:4> from the first and second latch addresses LAD<1:2>. The first decoder 320 may generate the first to fourth bank group addresses BG<1:4> which are selectively enabled, by decoding the first and second latch addresses LAD<1:2>. The first decoder 320 may generate the first to fourth bank group addresses BG<1:4> which are selectively enabled, by decoding the first and second latch addresses LAD<1:2> in synchronization with the write strobe signal WT_LAT. The first decoder 320 may generate the first to fourth bank group addresses BG<1:4> which are selectively enabled, by decoding the first and second latch addresses LAD<1:2> in synchronization with the read strobe signal RD_LAT.

The second decoder 330 may generate the first to fourth column addresses CADD<1:4> from the third and fourth latch addresses LAD<3:4>. The second decoder 330 may generate the first to fourth column addresses CADD<1:4> which are selectively enabled, by decoding the third and fourth latch addresses LAD<3:4>. The second decoder 330 may generate the first to fourth column addresses CADD<1:4> which are selectively enabled, by decoding the third and fourth latch addresses LAD<3:4> in synchronization with the write strobe signal WT_LAT. The second decoder 330 may generate the first to fourth column addresses CADD<1:4> which are selectively enabled, by decoding the third and fourth latch addresses LAD<3:4> in synchronization with the read strobe signal RD_LAT.

Figure 14:
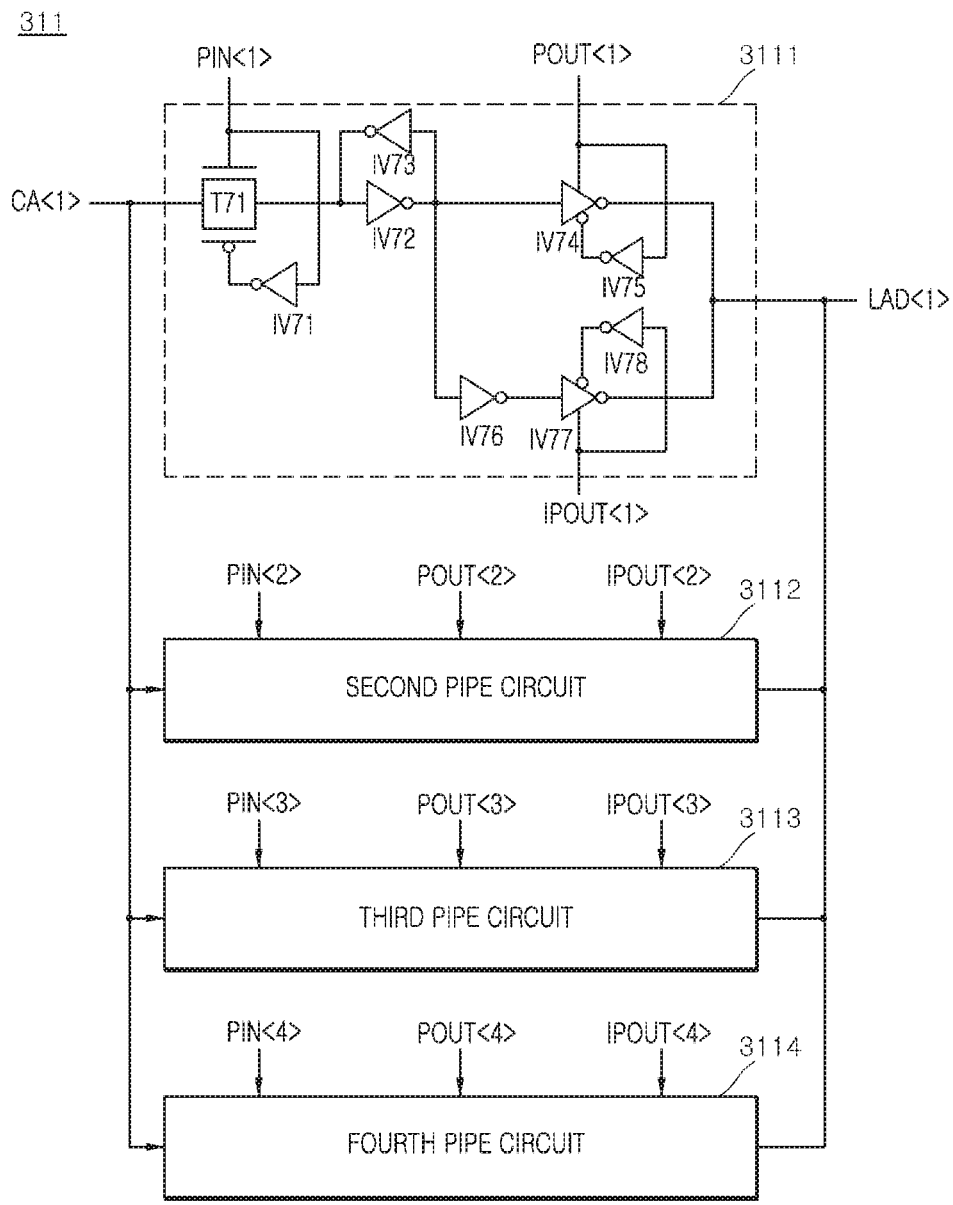
FIG. 14 is a diagram illustrating a configuration of a first address storage circuit included in a latch address generation circuit illustrated in FIG. 13.

FIG. 14 is a diagram illustrating a configuration of the first address storage circuit 311 in accordance with the embodiment. As illustrated in FIG. 14, the first address storage circuit 311 may include a first pipe circuit 3111, a second pipe circuit 3112, a third pipe circuit 3113, and a fourth pipe circuit 3114.

The first pipe circuit 3111 may be realized by a transfer gate T71 and inverters IV71, IV72, IV73, IV74, IV75, IV76, IV77, and IV78. The first pipe circuit 3111 may latch the first address which is inputted through the first command address CA<1>, in the case where the first input control signal PIN<1> is enabled. The first pipe circuit 3111 may generate the first latch address LAD<1> by buffering the latched first address, in the case where the first output control signal POUT<1> is enabled. The first pipe circuit 3111 may generate the first latch address LAD<1> by inverting and buffering the latched first address, in the case where the first internal output control signal IPOUT<1> is enabled.

The second pipe circuit 3112 may latch the first address which is inputted through the first command address CA<1>, in the case where the second input control signal PIN<2> is enabled. The second pipe circuit 3112 may generate the first latch address LAD<1> by buffering the latched first address, in the case where the second output control signal POUT<2> is enabled. The second pipe circuit 3112 may generate the first latch address LAD<1> by inverting and buffering the latched first address, in the case where the second internal output control signal IPOUT<2> is enabled.

The third pipe circuit 3113 may latch the first address which is inputted through the first command address CA<1>, in the case where the third input control signal PIN<3> is enabled. The third pipe circuit 3113 may generate the first latch address LAD<1> by buffering the latched first address, in the case where the third output control signal POUT<3> is enabled. The third pipe circuit 3113 may generate the first latch address LAD<1> by inverting and buffering the latched first address, in the case where the third internal output control signal IPOUT<3> is enabled.

The fourth pipe circuit 3114 may latch the first address which is inputted through the first command address CA<1>, in the case where the fourth input control signal PIN<4> is enabled. The fourth pipe circuit 3114 may generate the first latch address LAD<1> by buffering the latched first address, in the case where the fourth output control signal POUT<4> is enabled. The fourth pipe circuit 3114 may generate the first latch address LAD<1> by inverting and buffering the latched first address, in the case where the fourth internal output control signal IPOUT<4> is enabled.

Because the second to fourth pipe circuits 3112 to 3114 are realized by the same circuit and perform the same operation as the first pipe circuit 3111 illustrated in FIG. 14 except that input/output signals are different, detailed descriptions thereof will be omitted herein. The first to fourth pipe circuits 3111 to 3114 may be realized to generate the first latch address LAD<1> by latching the first command address CA<1> which is inputted four times in correspondence to the bit number of the first to fourth input control signals PIN<1:4>, the first to fourth output control signals POUT<1:4> and the first to fourth internal output control signals IPOUT<1:4>. The first address storage circuit 311 may be realized to include various numbers of pipe circuits depending on an embodiment.

Meanwhile, because the second address storage circuit 312 illustrated in FIG. 13 is realized by the same circuit and performs the same operation as the first address storage circuit 311 illustrated in FIG. 14 except that input/output signals are different, detailed descriptions thereof will be omitted herein.

Figure 15:
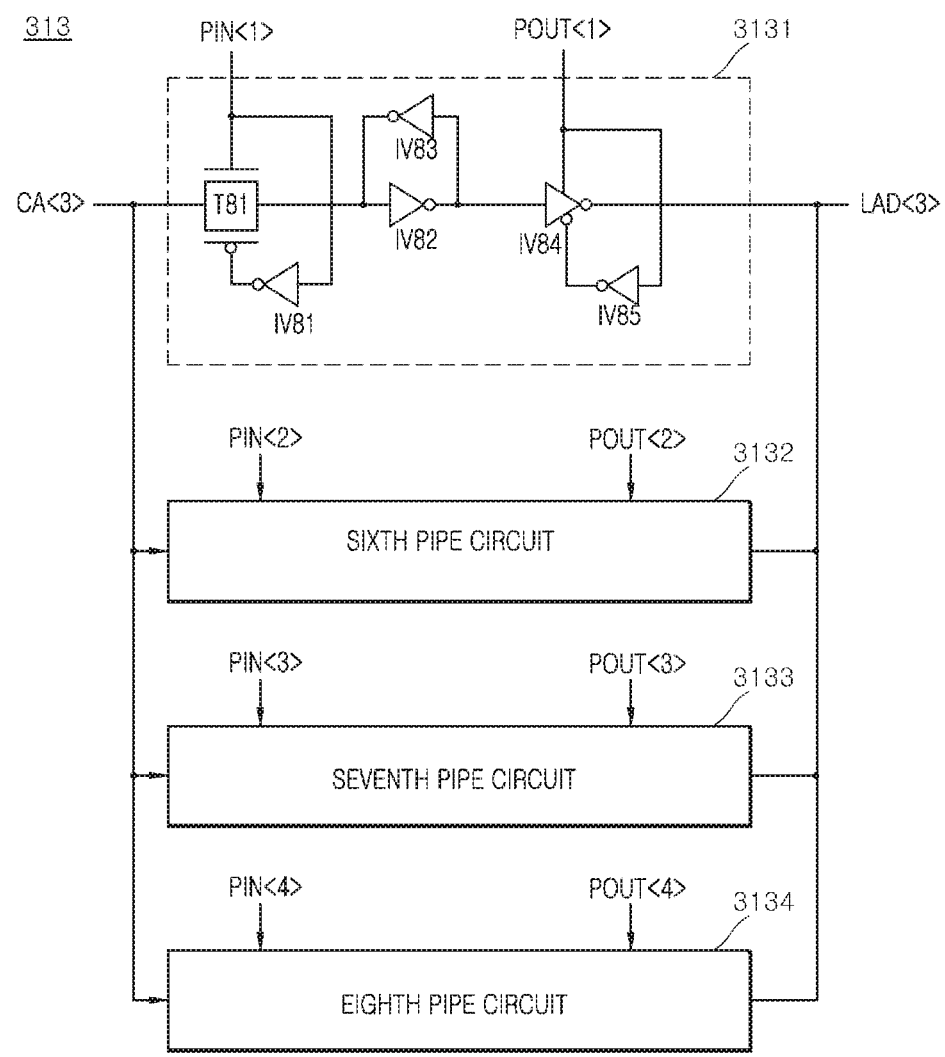
FIG. 15 is a diagram illustrating a configuration of a third address storage circuit included in the latch address generation circuit illustrated in FIG. 13.

FIG. 15 is a diagram illustrating a configuration of the third address storage circuit 313 in accordance with the embodiment. As illustrated in FIG. 15, the third address storage circuit 313 may include a fifth pipe circuit 3131, a sixth pipe circuit 3132, a seventh pipe circuit 3133, and an eighth pipe circuit 3134.

The fifth pipe circuit 3131 may be realized by a transfer gate T81 and inverters IV81, IV82, IV83, IV84, and IV85. The fifth pipe circuit 3131 may latch the third address which is inputted through the third command address CA<3>, in the case where the first input control signal PIN<1> is enabled. The fifth pipe circuit 3131 may generate the third latch address LAD<3> by buffering the latched third address, in the case where the first output control signal POUT<1> is enabled.

The sixth pipe circuit 3132 may latch the third address which is inputted through the third command address CA<3>, in the case where the second input control signal PIN<2> is enabled. The sixth pipe circuit 3132 may generate the third latch address LAD<3> by buffering the latched third address, in the case where the second output control signal POUT<2> is enabled.

The seventh pipe circuit 3133 may latch the third address which is inputted through the third command address CA<3>, in the case where the third input control signal PIN<3> is enabled. The seventh pipe circuit 3133 may generate the third latch address LAD<3> by buffering the latched third address, in the case where the third output control signal POUT<3> is enabled.

The eighth pipe circuit 3134 may latch the third address which is inputted through the third command address CA<3>, in the case where the fourth input control signal PIN<4> is enabled. The eighth pipe circuit 3134 may generate the third latch address LAD<3> by buffering the latched third address, in the case where the fourth output control signal POUT<4> is enabled.

Because the sixth to eighth pipe circuits 3132 to 3134 are realized by the same circuit and perform the same operation as the fifth pipe circuit 3131 illustrated in FIG. 15 except that input/output signals are different, detailed descriptions thereof will be omitted herein. The fifth to eighth pipe circuits 3131 to 3134 may be realized to generate the third latch address LAD<3> by latching the third command address CA<3> which is inputted four times in correspondence to the bit number of the first to fourth input control signals PIN<1:4> and the first to fourth output control signals POUT<1:4>. The third address storage circuit 313 may be realized to include various numbers of pipe circuits depending on an embodiment.

Meanwhile, because the fourth address storage circuit 314 illustrated in FIG. 13 is realized by the same circuit and performs the same operation as the third address storage circuit 313 illustrated in FIG. 15 except that input/output signals are different, detailed descriptions thereof will be omitted herein.

Figure 16:
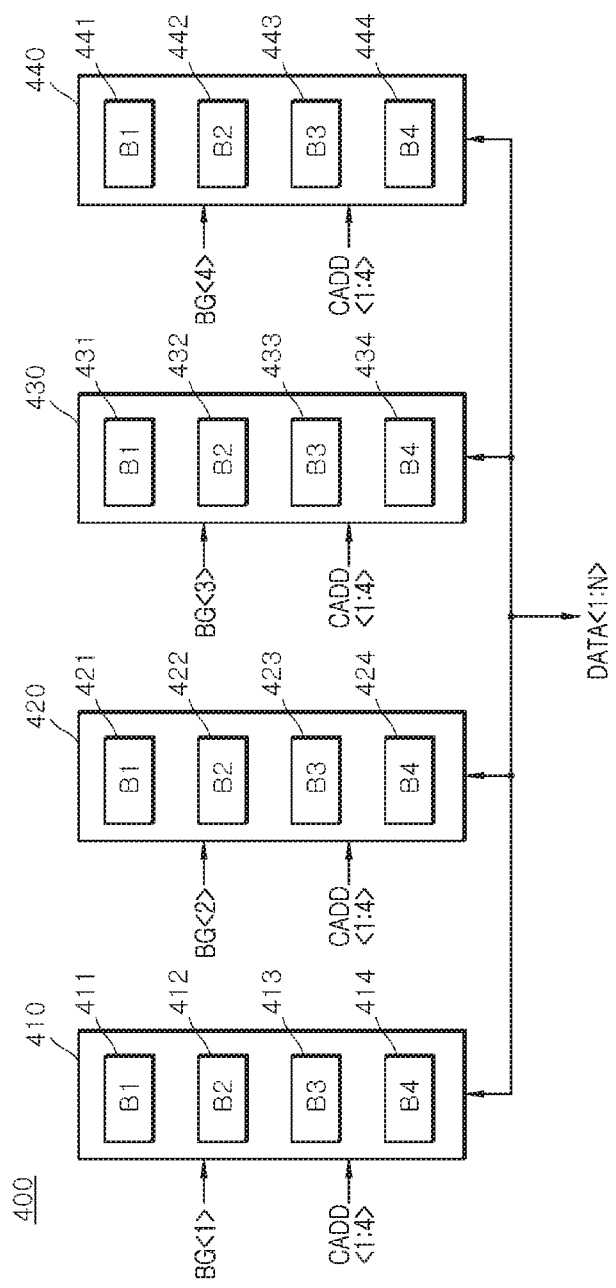
FIG. 16 is a block diagram illustrating a configuration of a core circuit included in the semiconductor device illustrated in FIG. 2.

FIG. 16 is a diagram illustrating a configuration of the core circuit 400 in accordance with the embodiment. As illustrated in FIG. 16, the core circuit 400 may include a first bank group 410, a second bank group 420, a third bank group 430, and a fourth bank group 440.

The first bank group 410 may include a first bank 411, a second bank 412, a third bank 413, and a fourth bank 414. The first bank 411 may be selected in the case where the first bank group address BG<1> is enabled and the first column address CADD<1> is enabled in a write operation and a read operation, and thereby, may store and output the data DATA<1:N>. The second bank 412 may be selected in the case where the first bank group address BG<1> is enabled and the second column address CADD<2> is enabled in a write operation and a read operation, and thereby, may store and output the data DATA<1:N>. The third bank 413 may be selected in the case where the first bank group address BG<1> is enabled and the third column address CADD<3> is enabled in a write operation and a read operation, and thereby, may store and output the data DATA<1:N>. The fourth bank 414 may be selected in the case where the first bank group address BG<1> is enabled and the fourth column address CADD<4> is enabled in a write operation and a read operation, and thereby, may store and output the data DATA<1:N>.

The second bank group 420 may include a fifth bank 421, a sixth bank 422, a seventh bank 423, and an eighth bank 424. The fifth bank 421 may be selected in the case where the second bank group address BG<2> is enabled and the first column address CADD<1> is enabled in a write operation and a read operation, and thereby, may store and output the data DATA<1:N>. The sixth bank 422 may be selected in the case where the second bank group address BG<2> is enabled and the second column address CADD<2> is enabled in a write operation and a read operation, and thereby, may store and output the data DATA<1:N>. The seventh bank 423 may be selected in the case where the second bank group address BG<2> is enabled and the third column address CADD<3> is enabled in a write operation and a read operation, and thereby, may store and output the data DATA<1:N>. The eighth bank 424 may be selected in the case where the second bank group address BG<2> is enabled and the fourth column address CADD<4> is enabled in a write operation and a read operation, and thereby, may store and output the data DATA<1:N>.

The third bank group 430 may include a ninth bank 431, a tenth bank 432, an eleventh bank 433, and a twelfth bank 434. The ninth bank 431 may be selected in the case where the third bank group address BG<3> is enabled and the first column address CADD<1> is enabled in a write operation and a read operation, and thereby, may store and output the data DATA<1:N>. The tenth bank 432 may be selected in the case where the third bank group address BG<3> is enabled and the second column address CADD<2> is enabled in a write operation and a read operation, and thereby, may store and output the data DATA<1:N>. The eleventh bank 433 may be selected in the case where the third bank group address BG<3> is enabled and the third column address CADD<3> is enabled in a write operation and a read operation, and thereby, may store and output the data DATA<1:N>. The twelfth bank 434 may be selected in the case where the third bank group address BG<3> is enabled and the fourth column address CADD<4> is enabled in a write operation and a read operation, and thereby, may store and output the data DATA<1:N>.

The fourth bank group 440 may include a thirteenth bank 441, a fourteenth bank 442, a fifteenth bank 443, and a sixteenth bank 444. The thirteenth bank 441 may be selected in the case where the fourth bank group address BG<4> is enabled and the first column address CADD<1> is enabled in a write operation and a read operation, and thereby, may store and output the data DATA<1:N>, The fourteenth bank 442 may be selected in the case where the fourth bank group address BG<4> is enabled and the second column address CADD<2> is enabled in a write operation and a read operation, and thereby, may store and output the data DATA<1:N>, The fifteenth bank 443 may be selected in the case where the fourth bank group address BG<4> is enabled and the third column address CADD<3> is enabled in a write operation and a read operation, and thereby, may store and output the data DATA<1:N>. The sixteenth bank 444 may be selected in the case where the fourth bank group address BG<4> is enabled and the fourth column address CADD<4> is enabled in a write operation and a read operation, and thereby, may store and output the data DATA<1:N>.

The first to fourth bank groups 410, 420, 430, and 440 may be realized to store and output 16-bit data by performing one column operation. The embodiment of the disclosure may be realized in such a manner that a column operation may be performed once in the first burst operation to store and output 16-bit data and a column operation may be performed twice in the second burst operation to store and output 32-bit data.

Figure 17:
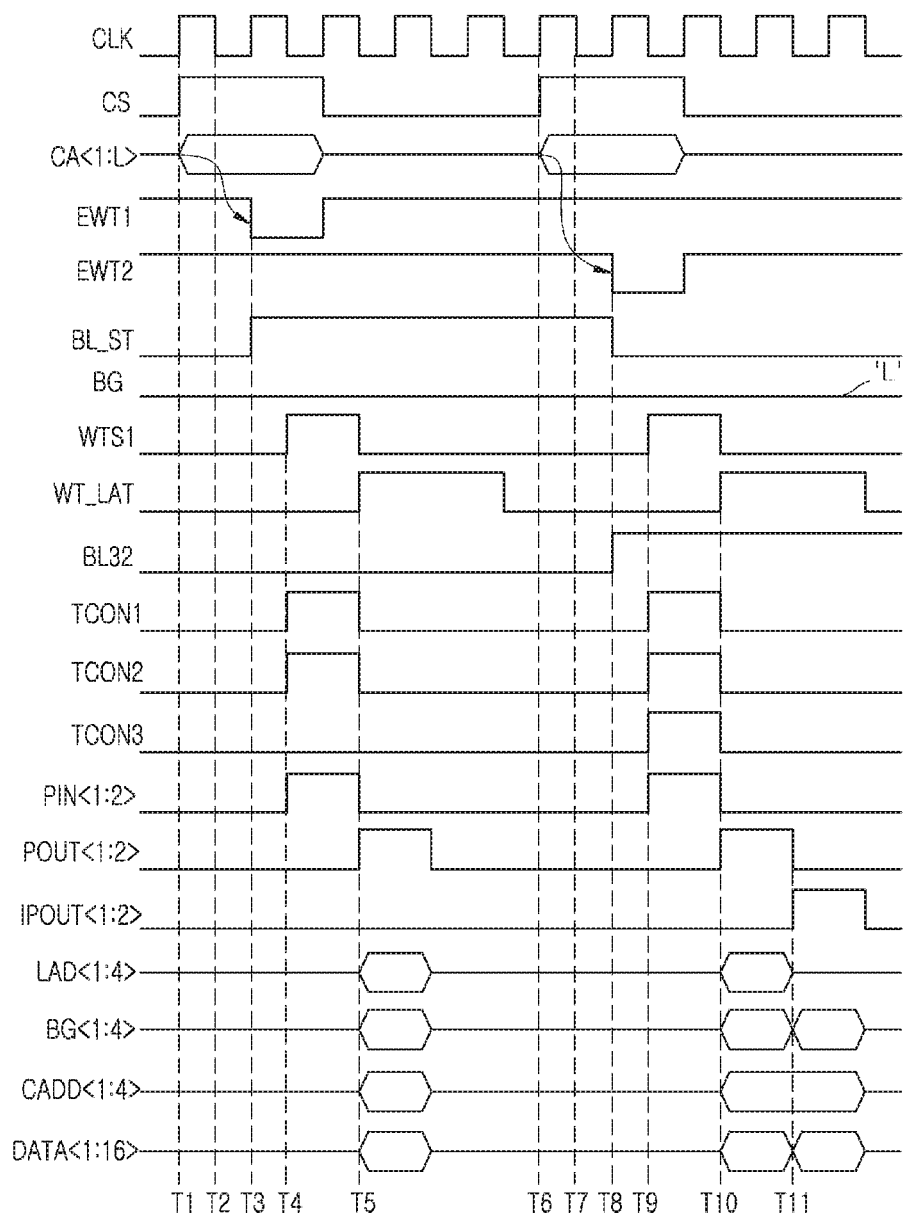
FIG. 17 is a timing diagram to assist in the explanation of first and second burst operations of the semiconductor system in accordance with the embodiment of the disclosure.

A write operation of the semiconductor system in accordance with the embodiment of the disclosure will be described with reference to FIG. 17 by exemplifying an operation in which the first burst operation and the second burst operation are successively performed.

At a time T1, the chip select signal CS and the first to L^th command addresses CA<1:L> of the first combination are inputted in synchronization with the rising edge of the clock CLK.

At a time T2, the first to fourth addresses are inputted through the first to fourth command addresses CA<1:4> in synchronization with the falling edge of the clock CLK.

At a time T3, the command pulse generation circuit 110 generates the first write command pulse EWT1 including a pulse of a logic low level, by the chip select signal CS and the first to L^th command addresses CA<1:L> of the first combination inputted at the time T1, in synchronization with the clock CLK. The command pulse generation circuit 110 generates the burst signal BL_ST of a logic high level by the bank group setting signal BG of a logic low level and the second write command pulse EWT2 of a logic high level.

At a time T4, the write mixing signal generation circuit 1211 generates the first write mixing signal WTS1 of a logic high level by mixing the first write command pulse EWT1 of a logic low level and the second write command pulse EWT2 of a logic high level.

The first transfer control signal generation circuit 211 generates the first transfer control signal TCON1 which is enabled to a logic high level, by the first write command pulse EWT1 of the time T3.

The first counter 212 generates the first transfer signal TS<1> of a logic high level by the first transfer control signal TCON1 of a logic high level.

The first signal transfer circuit 213 generates the first input control signal PIN<1> of a logic high level by buffering the first transfer signal TS<1> by the first transfer control signal TCON1 of a logic high level.

The latch address generation circuit 310 latches the first to fourth addresses which are inputted through the first to fourth command addresses CA<1:4> at the time T2, by the first input control signal PIN<1>.

The second transfer control signal generation circuit 221 generates the second transfer control signal TCON2 which is enabled to a logic high level, by the first write command pulse EWT1 of the time T3.

At a time T5, the command mixing circuit 120 generates the write strobe signal WT_LAT of a logic high level from the first write command pulse EWT1 by the bank group setting signal BG of a logic low level.

The second counter 222 generates the fifth transfer signal TS<5> of a logic high level by the second transfer control signal TCON2 of a logic high level.

The second signal transfer circuit 223 generates the first output control signal POUT<1> of a logic high level by buffering the fifth transfer signal TS<5> by the second transfer control signal TCON2 of a logic high level.

The latch address generation circuit 310 generates the first to fourth latch addresses LAD<1:4> by buffering the first to fourth addresses latched at the time T4, by the first output control signal POUT<1>.

The first decoder 320 generates the first to fourth bank group addresses BG<1:4> which are selectively enabled, by decoding the first and second latch addresses LAD<1:2> in synchronization with the write strobe signal WT_LAT of a logic high level.

The second decoder 330 generates the first to fourth column addresses CADD<1:4> which are selectively enabled, by decoding the third and fourth latch addresses LAD<3:4> in synchronization with the write strobe signal WT_LAT of a logic high level.

The core circuit 400 receives and stores data DATA<1:16> of 16 bits by performing a column operation for a bank group selected based on the first to fourth bank group addresses BG<1:4> and the first to fourth column addresses CADD<1:4>.

At this time, the core circuit 400 performs the first burst operation of storing the data DATA<1:16> of 16 bits.

At a time T6, the chip select signal CS and the first to L^th command addresses CA<1:L> of the second combination are inputted in synchronization with the rising edge of the clock CLK.

At a time T7, the first to fourth addresses are inputted through the first to fourth command addresses CA<1:4> in synchronization with the falling edge of the clock CLK.

At a time T8, the command pulse generation circuit 110 generates the second write command pulse EWT2 including a pulse of a logic low level, by the chip select signal CS and the first to L^th command addresses CA<1:L> of the second combination inputted at the time T6, in synchronization with the clock CLK. The command pulse generation circuit 110 generates the burst signal BL_ST of a logic low level based on the bank group setting signal BG of a logic low level and the second write command pulse EWT2 of a logic low level.

The mode signal generation circuit 130 generates the mode signal BL32 which is enabled to a logic high level, based on the bank group setting signal BG of a logic low level, the burst signal BL_ST of a logic low level and the second write command pulse EWT2 of a logic low level.

At a time T9, the write mixing signal generation circuit 1211 generates the first write mixing signal WTS1 of a logic high level by mixing the first write command pulse EWT1 of a logic high level and the second write command pulse EWT2 of a logic low level.

The first transfer control signal generation circuit 211 generates the first transfer control signal TCON1 which is enabled to a logic high level, based on the second write command pulse EWT2 of the time T8.

The first counter 212 generates the second transfer signal TS<2> of a logic high level based on the first transfer control signal TCON1 of a logic high level.

The first signal transfer circuit 213 generates the second input control signal PIN<2> of a logic high level by buffering the second transfer signal TS<2> based on the first transfer control signal TCON1 of a logic high level.

The latch address generation circuit 310 latches the first to fourth addresses which are inputted through the first to fourth command addresses CA<1:4> at the time T7, based on the second input control signal PIN<2>.

The second transfer control signal generation circuit 221 generates the second transfer control signal TCON2 which is enabled to a logic high level, based on the second write command pulse EWT2 of the time T8.

The third transfer control signal generation circuit 231 generates the third transfer control signal TCON3 which is enabled to a logic high level, based on the second write command pulse EWT2 of the time T8.

At a time T10, the command mixing circuit 120 generates the write strobe signal WT_LAT of a logic high level from the second write command pulse EWT2 based on the bank group setting signal BG of a logic low level.

The second counter 222 generates the sixth transfer signal TS<6> of a logic high level based on the second transfer control signal TCON2 of a logic high level.

The second signal transfer circuit 223 generates the second output control signal POUT<2> of a logic high level by buffering the sixth transfer signal TS<6> based on the second transfer control signal TCON2 of a logic high level.

The latch address generation circuit 310 generates the first to fourth latch addresses LAD<1:4> by buffering the first to fourth addresses latched at the time T9, based on the second output control signal POUT<2>.

The first decoder 320 generates the first to fourth bank group addresses BG<1:4> which are selectively enabled, by decoding the first and second latch addresses LAD<1:2> in synchronization with the write strobe signal WT_LAT of a logic high level.

The second decoder 330 generates the first to fourth column addresses CADD<1:4> which are selectively enabled, by decoding the third and fourth latch addresses LAD<3:4> in synchronization with the write strobe signal WT_LAT of a logic high level.

The core circuit 400 receives and stores data DATA<1:16> of 16 bits by performing a column operation for a bank group selected based on the first to fourth bank group addresses BG<1:4> and the first to fourth column addresses CADD<1:4>.

At this time, the core circuit 400 performs the first burst operation of storing the data DATA<1:16> of 16 bits.

At a time T11, the third counter 232 generates the second internal transfer signal ITS<2> of a logic high level based on the third transfer control signal TCON3 of the time T8.

The third signal transfer circuit 233 generates the second internal output control signal IPOUT<2> of a logic high level by buffering the second internal transfer signal ITS<2> based on the mode signal BL32 of a logic high level and the third transfer control signal TCON3 of a logic high level.

The latch address generation circuit 310 generates the first to fourth latch addresses LAD<1:4> by inverting and buffering the first to fourth addresses latched at the time T9, based on the second internal output control signal IPOUT<2>.

The first decoder 320 generates the first to fourth bank group addresses BG<1:4> which are selectively enabled, by decoding the first and second latch addresses LAD<1:2> in synchronization with the write strobe signal WT_LAT of a logic high level.

The second decoder 330 generates the first to fourth column addresses CADD<1:4> which are selectively enabled, by decoding the third and fourth latch addresses LAD<3:4> in synchronization with the write strobe signal WT_LAT of a logic high level.

The core circuit 400 receives and stores data DATA<1:16> of 16 bits by performing a column operation for a bank group selected based on the first to fourth bank group addresses BG<1:4> and the first to fourth column addresses CADD<1:4>.

At this time, the core circuit 400 performs the first burst operation of storing the data DATA<1:16> of 16 bits.

That is to say, the core circuit 400 performs the second burst operation of storing 32-bit data by storing the 16-bit data DATA<1:16> at the time T10 and the 16-bit data DATA<1:16> at the time T11.

As is apparent from the above descriptions, a semiconductor device according to an embodiment of the present disclosure may perform a column operation by generating an address for selecting a bank group, through internal inversion or non-inversion, depending on a burst operation. Also, in a semiconductor device according to an embodiment of the present disclosure, by generating an address for selecting a bank group, through internal inversion, depending on a burst operation, an area may be reduced because a separate circuit for inverting an address is not needed.

Figure 18:
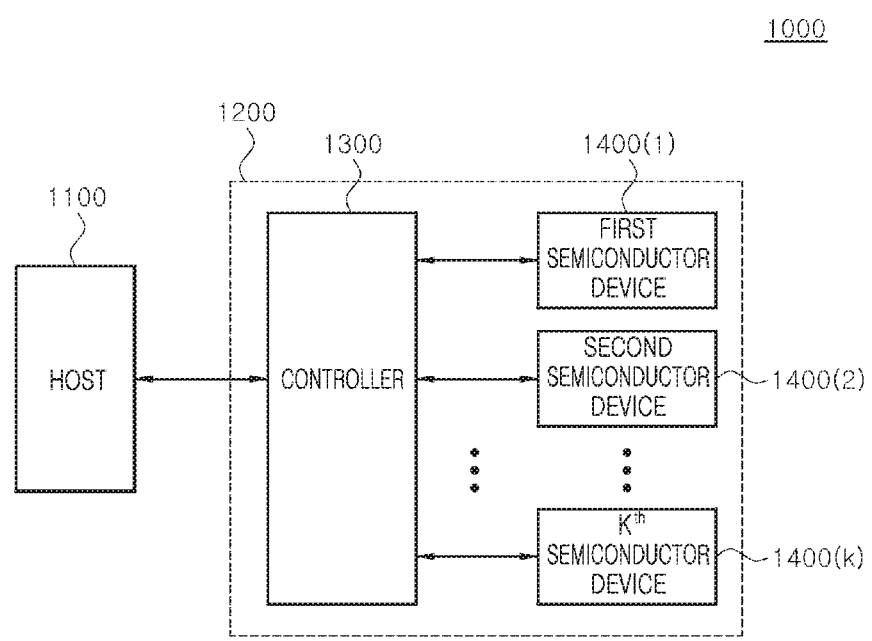
FIG. 18 is a block diagram illustrating a configuration of an electronic system in accordance with an embodiment of the disclosure.

FIG. 18 is a block diagram illustrating a configuration of an electronic system 1000 in accordance with an embodiment of the disclosure. As illustrated in FIG. 18, the electronic system 1000 may include a host 1100 and a semiconductor system 1200.

The host 1100 and the semiconductor system 1200 may transmit signals to each other by using an interface protocol. Examples of the interface protocol used between the host 1100 and the semiconductor system 1200 may include MMC (multimedia card), ESDI (enhanced small disk interface), IDE (integrated drive electronics), PCI-E (peripheral component interconnect-express), ATA (advanced technology attachment), SATA (serial ATA), PATA (parallel ATA), SAS (serial attached SCSI), and USB (universal serial bus).

The semiconductor system 1200 may include a controller 1300 and semiconductor devices 1400(*k*:1). The controller 1300 may control the semiconductor devices 1400(*k*:1) such that the semiconductor devices 1400(*k*:1) perform a write operation and a read operation. Each of the semiconductor devices 1400(*k*:1) may perform a column operation by generating an address for selecting a bank group, through internal inversion or non-inversion, according to first and second burst operations. As each of the semiconductor devices 1400(*k*:1) generates an address for selecting a bank group, through internal inversion, according to the second burst operation, a separate circuit for inverting an address is not needed, which makes it possible to reduce an area.

The controller 1300 may be realized by the controller 10 illustrated in FIG. 1. Each of the semiconductor devices 1400(*k*:1) may be realized by the semiconductor device 20 illustrated in FIG. 1. According to an embodiment, the semiconductor device 20 may be realized by one among a DRAM (dynamic random access memory), a PRAM (phase change random access memory), an RRAM (resistive random access memory), an MRAM (magnetic random access memory), and an FRAM (ferroelectric random access memory).

While various embodiments have been described above, it will be understood to those skilled in the art that the embodiments described are by way of example only. Accordingly, the semiconductor system and the semiconductor device described herein should not be limited based on the described embodiments.

What is claimed is:

1. A semiconductor device comprising:
   a command generation circuit configured to generate a write strobe signal including a pulse which is generated depending on a combination of a chip select signal and a command address in synchronization with a clock;
   a pipe control circuit configured to generate first to fourth input control signals and first to fourth output control signals which are sequentially enabled, when first and second write command pulses are inputted, and generate first to fourth internal output control signals after a preset period; and
   an address processing circuit configured to latch an address inputted through the command address, when the write strobe signal and the first to fourth input control signals are inputted, generate a bank group address and a column address from the latched address, when the first to fourth output control signals are inputted, and generate the bank group address and the column address by inverting the latched address, when the first to fourth internal output control signals are inputted.

2. The semiconductor device according to claim 1 further comprising a command pulse generation circuit configured to generate the first and second write command pulses from the command address which is inputted in synchronization with a first edge of the clock, wherein the address processing circuit is configured to generate the address from the command address which is inputted in synchronization with a second edge of the clock.

3. The semiconductor device according to claim 2, wherein the command pulse generation circuit configured to generate at least one of the first and second write command pulses including a pulse which is generated depending on a combination of the command address.

4. The semiconductor device according to claim 1, wherein the pipe control circuit configured to generate the first to fourth internal output control signal after the preset period which is set as a time for performing one column operation by the first and second write command pulses.

5. The semiconductor device according to claim 1, wherein the command generation circuit comprises:
   a command pulse generation circuit configured to generate the first and second write command pulses depending on the combination of the chip select signal and the command address in synchronization with the clock, and generate a burst signal depending on a bank group setting signal and the first and second write command pulses;
   a command mixing circuit configured to output any one of the first and second write command pulses as the write strobe signal or output the first write command puke as the write strobe signal, by the bank group setting signal; and
   a mode signal generation circuit configured to generate a mode signal which is enabled based on the bank group setting signal, the burst signal, and the second write command pulse.

6. The semiconductor device according to claim 5, wherein the command pulse generation circuit comprises:
   a command decoder configured to generate a first write signal which is enabled, when a logic level combination of the chip select signal and the command address is a first combination in synchronization with the clock, and generate a second write signal which is enabled, when the logic level combination of the chip select signal and the command address is a second combination in synchronization with the clock;
   a pulse generation circuit configured to generate the first and second write command pulses including pulses which are generated when the first and second write signals are inputted; and
   a burst signal generation circuit configured to generate the burst signal from the first and second write signals and the bank group setting signal.

7. The semiconductor device according to claim 5, wherein the command mixing circuit comprises:
- a write mixing signal generation circuit configured to generate a first write mixing signal by mixing the first and second write command pulses, and generate a second write mixing signal from the first write command pulse; and
- a selective transfer circuit configured to output any one of the first write mixing signal and the second write mixing signal as the write strobe signal based on the bank group setting signal.

8. The semiconductor device according to claim 5, wherein the mode signal generation circuit comprises:
- a pre-mode signal generation circuit configured to generate a pre-mode signal based on the bank group setting signal and the burst signal; and
- a latch circuit configured to latch the pre-mode signal based on a latch control signal generated from the second write command pulse, and generate the mode signal by buffering the latched pre-mode signal.

9. The semiconductor device according to claim 1, wherein the pipe control circuit comprises:
- an input control signal generation circuit configured to generate the first to fourth input control signals which are enabled, when any one of the first and second write command pulses is inputted;
- an output control signal generation circuit configured to generate the first to fourth output control signals which are enabled, when any one of the first and second write command pulses is inputted; and
- an internal output control signal generation circuit configured to generate the first to fourth internal output control signals which are enabled, after the preset period, by the second write command pulse and the mode signal.

10. The semiconductor device according to claim 9, wherein the input control signal generation circuit comprises:
- a first transfer control signal generation circuit configured to generate a first transfer control signal which is enabled, when any one of the first and second write command pulses is inputted;
- a first counter configured to generate first to fourth transfer signals which are sequentially counted, when the first transfer control signal is inputted; and
- a first signal transfer circuit configured to generate the first to fourth input control signals by buffering the first to fourth transfer signals, when the first transfer control signal is enabled.

11. The semiconductor device according to claim 9, wherein the output control signal generation circuit comprises:
- a second transfer control signal generation circuit configured to generate a second transfer control signal which is enabled, when any one of the first and second write command pulses is inputted;
- a second counter configured to generate fifth to eighth transfer signals which are sequentially counted, when the second transfer control signal is inputted; and
- a second signal transfer circuit configured to generate the first to fourth output control signals by buffering the fifth to eighth transfer signals, when the second transfer control signal is enabled.

12. The semiconductor device according to claim 9, wherein the internal output control signal generation circuit comprises:
- a third transfer control signal generation circuit configured to generate a third transfer control signal which is enabled, when the second write command pulse is inputted;
- a third counter configured to generate first to fourth internal transfer signals which are sequentially counted, when the third transfer control signal is inputted; and
- a third signal transfer circuit configured to generate the first to fourth internal output control signals by buffering the first to fourth internal transfer signals, when the mode signal is enabled and the third transfer control signal is enabled.

13. The semiconductor device according to claim 1, wherein the address processing circuit comprises:
- a latch address generation circuit configured to latch first to fourth addresses inputted through first to fourth command addresses, based on the first to fourth input control signals, generate first to fourth latch addresses from the latched first to fourth addresses, based on the first to fourth output control signals, and generate the first to fourth latch addresses by inverting and buffering the latched first to fourth addresses, based on the first to fourth internal output control signals;
- a first decoder configured to generate first to fourth bank group addresses by decoding the first and second latch addresses in synchronization with the write strobe signal; and
- a second decoder configured to generate first to fourth column addresses by decoding the third and fourth latch addresses in synchronization with the write strobe signal.

14. A semiconductor device comprising:
- a pipe control circuit configured to generate first to fourth input control signals and first to fourth output control signals which are sequentially enabled, when a first write command pulse is inputted in a first burst operation, and generate the first to fourth input control signals and the first to fourth output control signals which are sequentially enabled and generate first to fourth internal output control signals after a preset period, when a second write command puke is inputted in a second burst operation; and
- an address processing circuit configured to latch an address inputted through a command address, when a write strobe signal and the first to fourth input control signals are inputted, generate a bank group address and a column address from the latched address, when the first to fourth output control signals are inputted, and generate the bank group address and the column address by inverting the latched address, when the first to fourth internal output control signals are inputted.

15. The semiconductor device according to claim 14, further comprising a core circuit including a bank group, the bank group configured to perform the first and second burst operations based on the bank group address and the column address, wherein the first and second burst operations are set as column operations of inputting/outputting data in a bank group selected based on the bank group address and the column address.

16. The semiconductor device according to claim 14, further comprising a core circuit including a bank group, the bank group configured to perform the first and second burst operations based on the bank group address and the column address, wherein the second burst operation is set to be twice the first burst operation in terms of a bit number of data to be inputted/outputted in a column operation.

17. The semiconductor device according to claim 14, further comprising a command pulse generation circuit configured to generate the first and second write command pulses from the command address which is inputted in synchronization with a first edge of a clock, wherein the address processing circuit is configured to generate the address from the command address which is inputted in synchronization with a second edge of the clock.

18. The semiconductor device according to claim 14, wherein the pipe control circuit is configured to generate the first to fourth internal output control signals after the preset period which is set as a time for performing one column operation by the first and second write command pulses.

19. The semiconductor device according to claim 14, wherein the pipe control circuit comprises:
an input control signal generation circuit configured to generate the first to fourth input control signals which are enabled, when any one of the first and second write command pulses is inputted;
an output control signal generation circuit configured to generate the first to fourth output control signals which are enabled, when any one of the first and second write command pulses is inputted; and
an internal output control signal generation circuit configured to generate the first to fourth internal output control signals which are enabled, after the preset period by the second write command pulse and a mode signal.

20. The semiconductor device according to claim 19, further comprising a mode signal generation circuit is configured to generate the mode signal which is disabled in the first burst operation, and the mode signal generation circuit is configured to generate the mode signal which is enabled in the second burst operation.

21. The semiconductor device according to claim 19, wherein the input control signal generation circuit comprises:
a first transfer control signal generation circuit configured to generate a first transfer control signal which is enabled, when any one of the first and second write command pulses is inputted;
a first counter configured to generate first to fourth transfer signals which are sequentially counted, when the first transfer control signal is inputted; and
a first signal transfer circuit configured to generate the first to fourth input control signals by buffering the first to fourth transfer signals, when the first transfer control signal is enabled.

22. The semiconductor device according to claim 19, wherein the output control signal generation circuit comprises:
a second transfer control signal generation circuit configured to generate a second transfer control signal which is enabled, when any one of the first and second write command pulses is inputted;
a second counter configured to generate fifth to eighth transfer signals which are sequentially counted, when the second transfer control signal is inputted; and
a second signal transfer circuit configured to generate the first to fourth output control signals by buffering the fifth to eighth transfer signals, when the second transfer control signal is enabled.

23. The semiconductor device according to claim 19, wherein the internal output control signal generation circuit comprises:
a third transfer control signal generation circuit configured to generate a third transfer control signal which is enabled, when the second write command pulse is inputted;
a third counter configured to generate first to fourth internal transfer signals which are sequentially counted, when the third transfer control signal is inputted; and
a third signal transfer circuit configured to generate the first to fourth internal output control signals by buffering the first to fourth internal transfer signals, when the mode signal is enabled and the third transfer control signal is enabled.

24. The semiconductor device according to claim 14, wherein the address processing circuit comprises:
a latch address generation circuit configured to latch first to fourth addresses inputted through first to fourth command addresses, based on the first to fourth input control signals, generate first to fourth latch addresses from the latched first to fourth addresses, based on the first to fourth output control signals, and generate the first to fourth latch addresses by inverting and buffering the latched first to fourth addresses, by the first to fourth internal output control signals;
a first decoder configured to generate first to fourth bank group addresses by decoding the first and second latch addresses in synchronization with the write strobe signal; and
a second decoder configured to generate first to fourth column addresses by decoding the third and fourth latch addresses in synchronization with the write strobe signal.

25. The semiconductor device according to claim 14, further comprising:
a command generation circuit configured to generate the first and second write command pulses which include pulses generated depending on a combination of a chip select signal and the command address in synchronization with the clock, and generate the write strobe signal from the first and second write command pulses; and
a core circuit configured to input/output data by performing a column operation through any one of a plurality of bank groups which is selected by the bank group address and the column address.

26. The semiconductor device according to claim 25, wherein the command generation circuit comprises:
a command pulse generation circuit configured to generate the first and second write command pulses depending on the combination of the chip select signal and the command address in synchronization with the clock, and generate a burst signal depending on a bank group setting signal and the first and second write command pulses;
a command mixing circuit configured to output any one of the first and second write command pulses as the write strobe signal or output the first write command pulse as the write strobe signal, based on the bank group setting signal; and
a mode signal generation circuit configured to generate the mode signal based on the bank group setting signal, the burst signal and the second write command pulse.

27. The semiconductor device according to claim 26, wherein the command pulse generation circuit comprises:
a command decoder configured to generate a first e signal which is enabled, when a logic level combination of the chip select signal and the command address is a first combination in synchronization with the dock, and generate a second write signal which is enabled, when the logic level combination of the chip select signal and the command address is a second combination in synchronization with the clock;

a pulse generation circuit configured to generate the first and second write command pulses including pulses which are generated when the first and second write signals are inputted; and a burst signal generation circuit configured to generate the burst signal from the first and second write signals by the bank group setting signal.

28. The semiconductor device according to claim 26, wherein the command mixing circuit comprises:

a write mixing signal generation circuit configured to generate a first write mixing signal by mixing the first and second write command pulses, and generate a second write mixing signal from the first write command pulse; and a selective transfer circuit configured to output any one of the first write mixing signal and the second write mixing signal as the write strobe signal based on the bank group setting signal.

29. The semiconductor device according to claim 26, wherein the mode signal generation circuit comprises:

a pre-mode signal generation circuit configured to generate a pre-mode signal based on the bank group setting signal and the burst signal; and a latch circuit configured to latch the pre-mode signal based on a latch control signal generated from the second write command pulse, and generate the mode signal by buffering the latched pre-mode signal.

* * * * *